(12) United States Patent
Yoshida et al.

(10) Patent No.: US 10,580,853 B2
(45) Date of Patent: Mar. 3, 2020

(54) SEMICONDUCTOR DEVICE AND METHOD OF MANUFACTURING SEMICONDUCTOR DEVICE

(71) Applicants: FUJI ELECTRIC CO., LTD., Kawasaki-shi, Kanagawa (JP); DENSO CORPORATION, Kariya-shi, Aichi (JP)

(72) Inventors: Souichi Yoshida, Nagano (JP); Seiji Noguchi, Nagano (JP); Kenji Kouno, Kariya (JP); Hiromitsu Tanabe, Kariya (JP)

(73) Assignees: FUJI ELECTRIC CO., LTD., Kawasaki-Shi, Kanagawa (JP); DENSO CORPORATION, Kariya-Shi, Aichi (JP)

(*) Notice: Subject to any disclaimer, the term of this patent is extended or adjusted under 35 U.S.C. 154(b) by 0 days.

(21) Appl. No.: 15/686,216

(22) Filed: Aug. 25, 2017

(65) Prior Publication Data

US 2017/0373141 A1 Dec. 28, 2017

Related U.S. Application Data

(63) Continuation of application No. PCT/JP2016/067456, filed on Jun. 10, 2016.

(30) Foreign Application Priority Data

Jun. 17, 2015 (JP) ................................. 2015-122469

(51) Int. Cl.
*H01L 29/06* (2006.01)
*H01L 29/08* (2006.01)
(Continued)

(52) U.S. Cl.
CPC ........ *H01L 29/0638* (2013.01); *H01L 21/221* (2013.01); *H01L 21/2253* (2013.01);
(Continued)

(58) Field of Classification Search
CPC ..... H01L 27/0664; H01L 27/04; H01L 27/06; H01L 27/088; H01L 29/0638;
(Continued)

(56) References Cited

U.S. PATENT DOCUMENTS

2005/0258493 A1 11/2005 Aono et al.
2007/0108558 A1 5/2007 Nemoto
(Continued)

FOREIGN PATENT DOCUMENTS

JP H10-050724 A 2/1998
JP 2005-317751 A 11/2005
(Continued)

*Primary Examiner* — Natalia A Gondarenko
(74) *Attorney, Agent, or Firm* — Rabin & Berdo, P.C.

(57) ABSTRACT

A method of manufacturing a semiconductor device having an insulated gate bipolar transistor portion and a freewheeling diode portion. The method includes introducing an impurity to a rear surface of a semiconductor substrate, performing first heat treating to activate the impurity to form a field stop layer, performing a first irradiation to irradiate light ions from the rear surface of semiconductor substrate to form, in the semiconductor substrate, a first low-lifetime region, performing a second irradiation to irradiate the light ions from the rear surface of the semiconductor substrate to form, in the field stop layer, a second low-lifetime region, and performing second heat treating to reduce a density of defects generated in the field stop layer when the second irradiation is performed. Each of the first and second low-lifetime regions has a carrier lifetime thereof shorter than that of any region of the semiconductor device other than the first and second low-lifetime regions.

13 Claims, 18 Drawing Sheets

(51) Int. Cl.
   *H01L 29/66*    (2006.01)
   *H01L 29/10*    (2006.01)
   *H01L 29/40*    (2006.01)
   *H01L 29/167*   (2006.01)
   *H01L 29/739*   (2006.01)
   *H01L 29/861*   (2006.01)
   *H01L 21/22*    (2006.01)
   *H01L 21/225*   (2006.01)
   *H01L 21/8222*  (2006.01)
   *H01L 21/324*   (2006.01)
   *H01L 21/265*   (2006.01)
   *H01L 27/06*    (2006.01)

(52) U.S. Cl.
   CPC ...... *H01L 21/26513* (2013.01); *H01L 21/324* (2013.01); *H01L 27/0664* (2013.01); *H01L 29/0834* (2013.01); *H01L 29/167* (2013.01); *H01L 29/407* (2013.01); *H01L 29/66136* (2013.01); *H01L 29/66348* (2013.01); *H01L 29/7397* (2013.01); *H01L 29/8613* (2013.01); *H01L 29/1095* (2013.01)

(58) Field of Classification Search
   CPC ............... H01L 29/1095; H01L 29/167; H01L 29/7397; H01L 29/0834; H01L 29/8613; H01L 29/407; H01L 29/32; H01L 29/66136; H01L 29/66348; H01L 21/26506; H01L 21/221; H01L 21/26513; H01L 21/324; H01L 21/2253; H01L 21/8234; H01L 29/739; H01L 21/266
   USPC ......... 257/139, 140, E21.334, E29.198, 329, 257/655; 438/529, 530
   See application file for complete search history.

(56) References Cited

U.S. PATENT DOCUMENTS

| | | | |
|---|---|---|---|
| 2009/0283799 | A1 | 11/2009 | Ruething et al. |
| 2010/0187567 | A1* | 7/2010 | Tanabe ................ H01L 29/0615 257/140 |
| 2012/0043582 | A1 | 2/2012 | Koyama et al. |
| 2012/0313139 | A1* | 12/2012 | Matsuura ................ H01L 29/36 257/139 |
| 2013/0075783 | A1* | 3/2013 | Yamazaki ............. H01L 21/263 257/139 |
| 2014/0217463 | A1* | 8/2014 | Schulze ............ H01L 29/66333 257/139 |
| 2014/0299915 | A1 | 10/2014 | Kouno et al. |
| 2014/0377942 | A1* | 12/2014 | Noguchi ............... H01L 21/266 438/529 |
| 2015/0200247 | A1* | 7/2015 | Schmidt ............ H01L 29/66348 257/140 |
| 2016/0254374 | A1* | 9/2016 | Kameyama ......... H01L 29/7397 257/140 |

FOREIGN PATENT DOCUMENTS

| | | |
|---|---|---|
| JP | 2007-158320 A | 6/2007 |
| JP | 2008-103562 A | 5/2008 |
| JP | 2008-211148 A | 9/2008 |
| JP | 2011-238872 A | 11/2011 |
| JP | 2012-009629 A | 1/2012 |
| JP | 2012-043891 A | 3/2012 |
| JP | 2013-074181 A | 4/2013 |
| JP | 2013-138172 A | 7/2013 |
| JP | 2013-247248 A | 12/2013 |

* cited by examiner

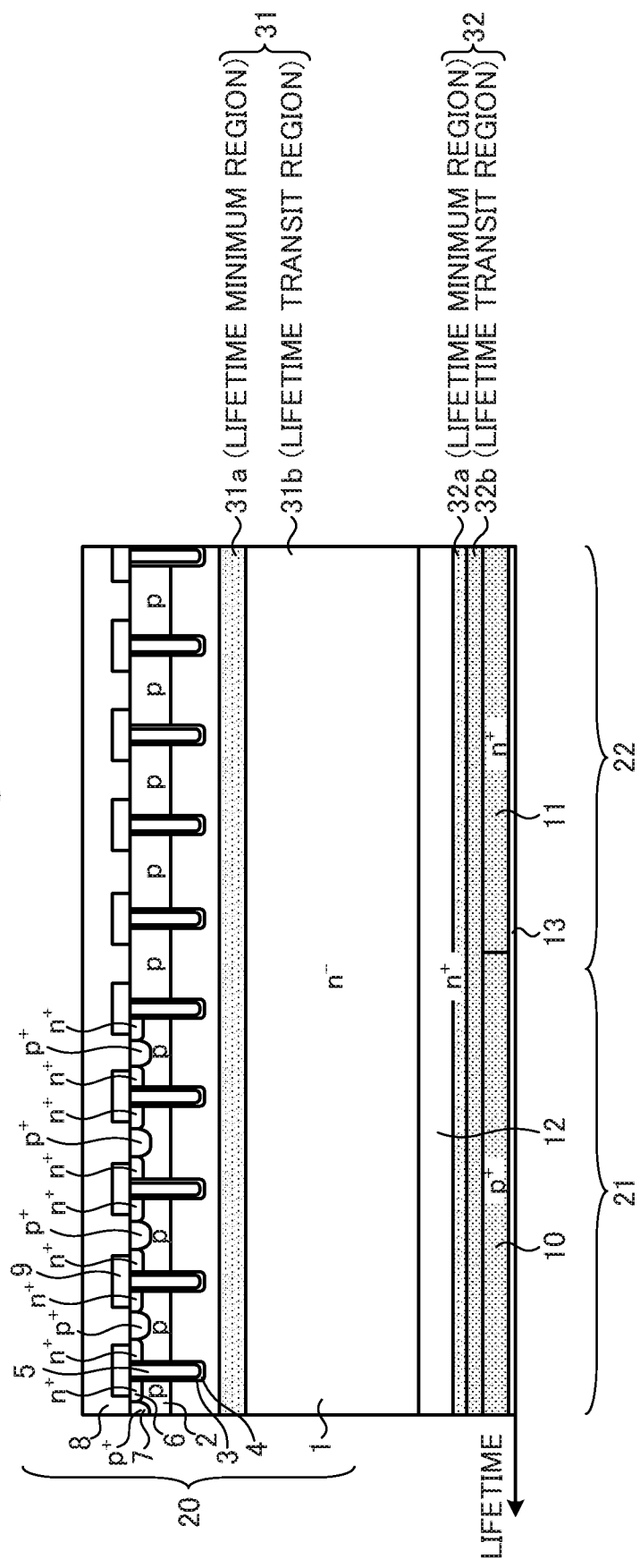

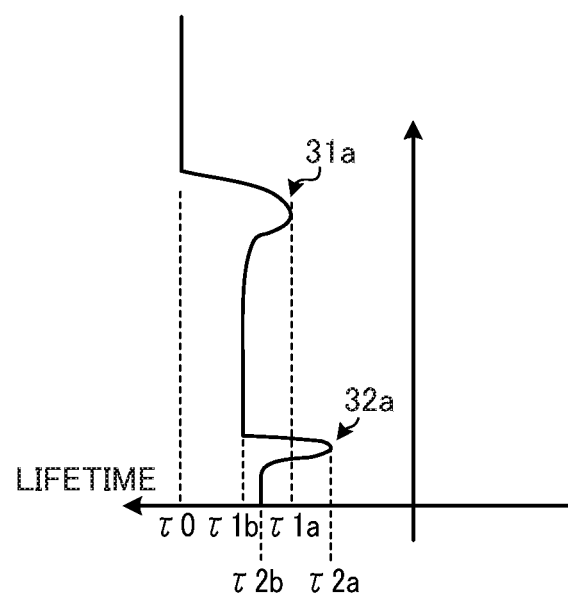

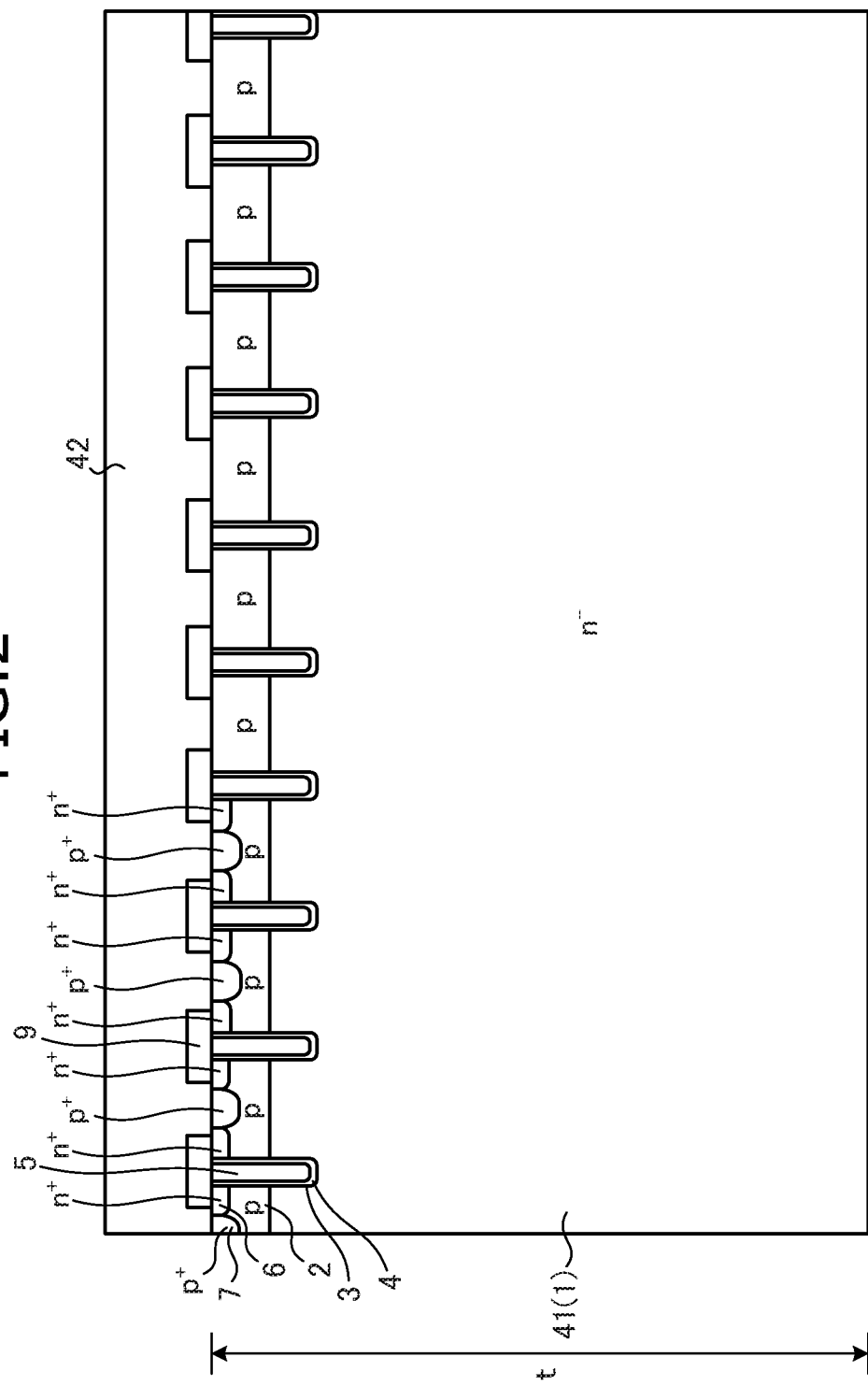

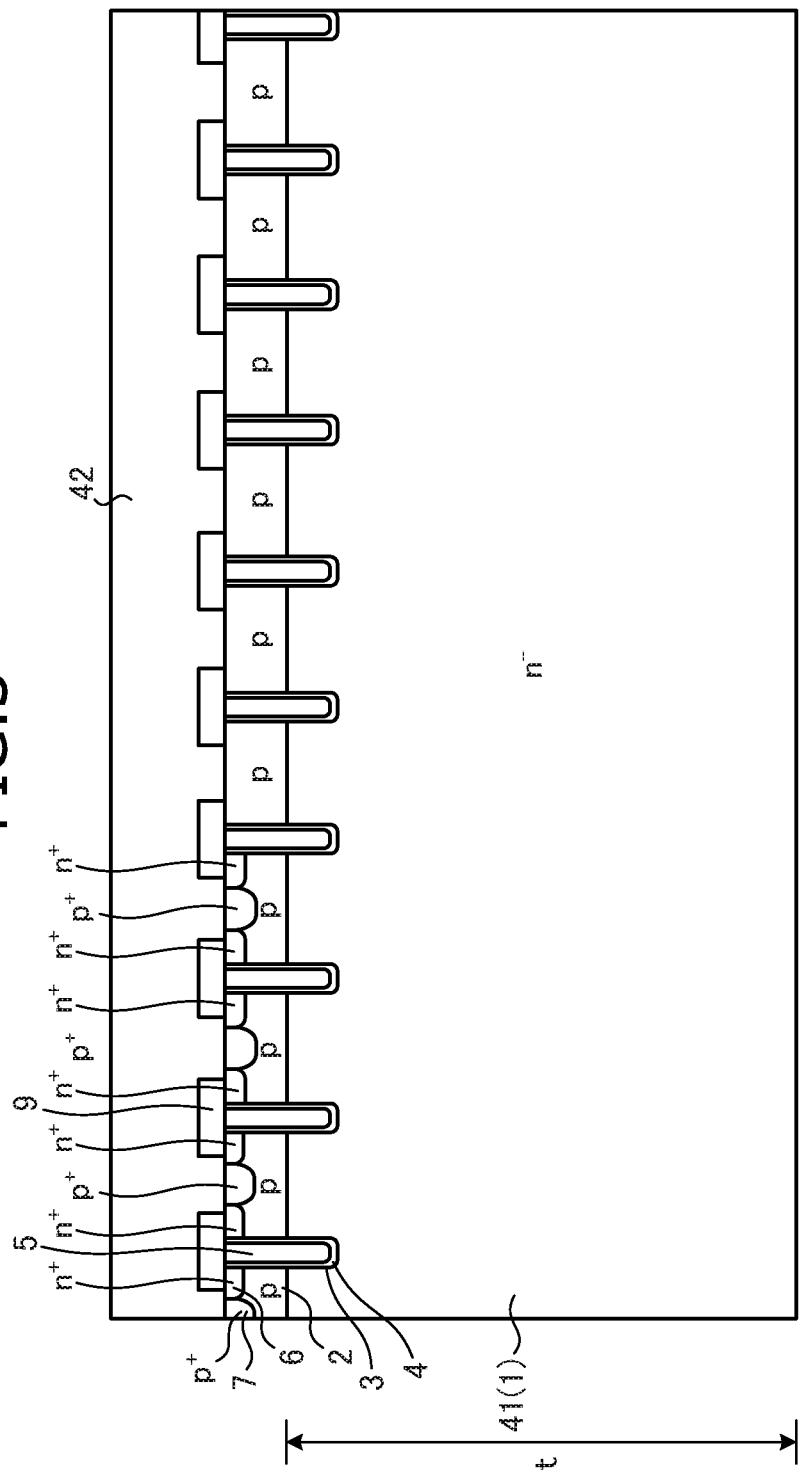

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2016/067456 filed on Jun. 10, 2016, which claims priority from a Japanese Patent Application No. 2015-122469, filed on Jun. 17, 2015, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Performance improvements of 600V, 1200V, and 1700V power semiconductor devices such as insulated gate bipolar transistors (IGBTs) and freewheeling diodes (FWDs) are advancing. Power semiconductor devices are used in power converting equipment such as inverters that achieve power savings and high efficiency and are necessary in motor control. There is rapid market demand concerning various characteristics of power semiconductor devices used for such applications, such as reduced loss (power savings), high-speed with high-efficiency, and environmental friendliness.

As a method of manufacturing a power semiconductor device meeting such demands, a method that manufactures an IGBT that is of low cost and has low electrical loss such as low ON voltage has been proposed. In particular, first, to prevent wafer cracking during wafer processing, wafer processing begins with an ordinarily adopted wafer that is thick. In the latter half of processing, the rear surface of the wafer is ground as much as possible to an extent that still enables desired characteristics to be obtained. Thereafter, from the ground rear surface of the wafer, an impurity is ion implanted to a desired impurity concentration and activated, forming a $p^+$-type collector region.

Recently, methods of manufacturing a low-cost semiconductor device having low electrical loss by reducing the thickness of such a wafer (semiconductor substrate), in particular, have become mainstream methods of developing and manufacturing power semiconductor devices. Further, a field stop (FS) structure IGBT is commonly known in which a FS layer is provided that suppresses a depletion layer, which spreads from a pn junction on a front surface of a semiconductor substrate in an ON state, from reaching the $p^+$-type collector region.

The following method has been proposed as a method of manufacturing a FS structure IGBT. First, a MOS gate (insulated gate including a metal oxide film semiconductor) is formed on a front surface of a semiconductor substrate. Next, after a rear surface of the semiconductor substrate is ground and a thickness of the semiconductor substrate is reduced, phosphorus (P) or selenium (Se) is ion implanted from the ground rear surface of the semiconductor substrate, forming a field stop layer. Next, boron (B) is ion implanted into the rear surface of the semiconductor substrate, forming a $p^+$-type collector region (for example, refer to Japanese Laid-Open Patent Publication No. 2008-211148 (see, e.g., paragraphs 0044 to 0049) and Japanese Laid-Open Patent Publication No. 2008-103562 (see, e.g., paragraphs 0017 to 0018))

The following method has been further proposed as a method of manufacturing a FS structure diode. First, a p-type anode layer is formed on a front surface of a wafer. Next, protons are irradiated from a side of the p-type anode layer. Next, a rear surface of the wafer is ground, reducing the thickness of the wafer overall. Next, selenium is ion implanted into the rear surface of the wafer. Next, heat treatment is performed. By these processes, the implanted selenium diffuses from the rear surface of the wafer to an anode side, forming an n-type cathode buffer layer. Further, protons introduced into the wafer become donors, forming a proton buffer layer (for example, refer to Japanese Laid-Open Patent Publication No. 2007-158320 (see, e.g., paragraphs 0097 to 0101)).

Further, to reduce an overall size of power converting equipment, development of a reverse conducting IGBT (RC-IGBT) having an integrated structure in which an IGBT and a freewheel diode (FWD) connected in antiparallel to the IGBT are implemented on a single substrate is advancing. The following method has been proposed as a method of manufacturing a RC-IGBT. After formation of an $n^+$-type region of a diode at a portion of a ground drift region rear surface, selenium is ion implanted in the entire ground drift region rear surface. Next, furnace annealing is performed and the selenium implanted into the drift region rear surface is activated, forming a field stop region (for example, refer to Japanese Laid-Open Patent Publication No. 2012-9629).

The following method has been proposed as another method of manufacturing a RC-IGBT. From one main surface side of a substrate, helium (He) is irradiated, a low-lifetime region having a short lifetime is formed locally closer toward an emitter region in an N-type base layer. In this manner, by reducing carriers ejected during FWD reverse recovery operation, loss occurring during FWD reverse recovery operation is reduced (for example, refer to Japanese Laid-Open Patent Publication No. 2005-317751 (see, e.g., paragraph 0025)). Further, a method of forming a low-lifetime region in a drift layer by proton irradiation has been proposed as a method of manufacturing a RC-IGBT (for example, refer to U.S. Patent Application Publication No. 2009/283799).

SUMMARY OF THE INVENTION

According to one aspect of the present invention, a method of manufacturing a semiconductor device having an insulated gate bipolar transistor portion and a freewheeling diode portion, the insulated gate bipolar transistor portion including a semiconductor substrate having a drift layer of a first conductivity type; a base layer of a second conductivity type formed on a front surface side of the semiconductor substrate; an emitter region of the first conductivity type selectively formed in the base layer; an insulated gate region formed on the front surface side of the semiconductor substrate and having a gate insulating film and a gate electrode; an emitter electrode electrically connected to both the base layer and the emitter region; a collector region of the second conductivity type selectively formed on a rear surface side of the semiconductor substrate; and a collector electrode electrically connected to the collector region; and the freewheeling diode portion including an anode layer of the second conductivity type formed on the front surface side of the semiconductor substrate and electrically connected to the emitter electrode; and a cathode region of the first conductivity type selectively formed on the rear surface side of the semiconductor substrate and electrically connected to the collector electrode, includes: introducing a first-conductivity-type impurity to a rear surface of the semiconductor substrate; performing first heat treating of heat treating and activating the first-conductivity-type impurity, and forming a field stop layer of the first conductivity type at a position deeper than the collector region from the rear surface of the semiconductor substrate, the field stop layer having an impurity concentration higher than that of the drift layer; performing a first irradiation of irradiating light ions from the rear surface of semiconductor substrate and forming in the drift layer, a first low-lifetime region having carrier lifetime shorter than that of other regions; performing a second irradiation of irradiating the light ions from the rear surface of the semiconductor substrate and forming in the field stop layer, a second low-lifetime region having a carrier lifetime shorter than that of other regions; and performing second heat treating of reducing a defect density of defects generated in the field stop layer when the second irradiation is performed.

In the method, selenium is introduced as the first-conductivity-type impurity.

In the method, the second heat treating is performed so that the defect density of detects formed in the field stop layer is reduced and the light ions in the field stop layer are converted to donors.

In the method, the second heat treating is performed for one to two hours at a temperature of 350 to 370 degrees C.

In the method, the carrier lifetime of the second low-lifetime region is shorter than the carrier lifetime of the first low-lifetime region.

In the method, the light ions are one of helium and protons.

According to another aspect of the present invention, a semiconductor device includes an insulated gate bipolar transistor portion having: a semiconductor substrate having a drift layer of a first conductivity type, a base layer of a second conductivity type formed on a front surface side of the semiconductor substrate, an emitter region of the first conductivity type selectively formed in the base layer, an insulated gate region formed on the front surface side of the semiconductor substrate and having a gate insulating film and a gate electrode, an emitter electrode electrically connected to both the base layer and the emitter region, a collector region of the second conductivity type selectively formed on a rear surface side of the semiconductor substrate, and a collector electrode electrically connected to the collector region; a freewheeling diode portion having: an anode layer of the second conductivity type formed on the front surface side of the semiconductor substrate and electrically connected to the emitter electrode, and a cathode region of the first conductivity type selectively formed on the rear surface side of the semiconductor substrate and electrically connected to the collector electrode; a field stop layer of the first conductivity type formed at a position deeper than the collector region from the rear surface of the semiconductor substrate, the field stop layer having an impurity concentration higher than that of the drift layer; a first low-lifetime region formed in the drift layer, away from the field stop layer and having carrier lifetime shorter than that of other regions; and a second low-lifetime region formed in the field stop layer and having a carrier lifetime shorter than that of other regions.

In the semiconductor device, the field stop layer includes selenium as a dopant.

In the semiconductor device, the first low-lifetime region includes light ions.

In the semiconductor device, the second low-lifetime region includes light ions.

In the semiconductor device, in the second low-lifetime region, a region is formed in which the light ions are converted to donors.

In the semiconductor device, the light ions are one of helium and protons.

In the semiconductor device, the carrier lifetime of the second low-lifetime region is shorter than the carrier lifetime of the first low-lifetime region.

In the semiconductor device, the insulated gate region includes: a trench penetrating the base layer and the emitter region, and reaching the drift layer; the gate insulating film provided along an inner wall of the trench; and the gate electrode provided in the trench via the gate insulating film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1A is a cross-sectional view of a structure of a semiconductor device manufactured by a method of manufacturing a semiconductor device according to an embodiment;

FIG. 1B is a characteristics diagram of lifetime;

FIGS. 2, 3, 4, 5, 6, 7, 8, and 9 are cross-sectional views of the semiconductor device according to the embodiment during manufacture;

DETAILED DESCRIPTION OF THE INVENTION

Figure 4:
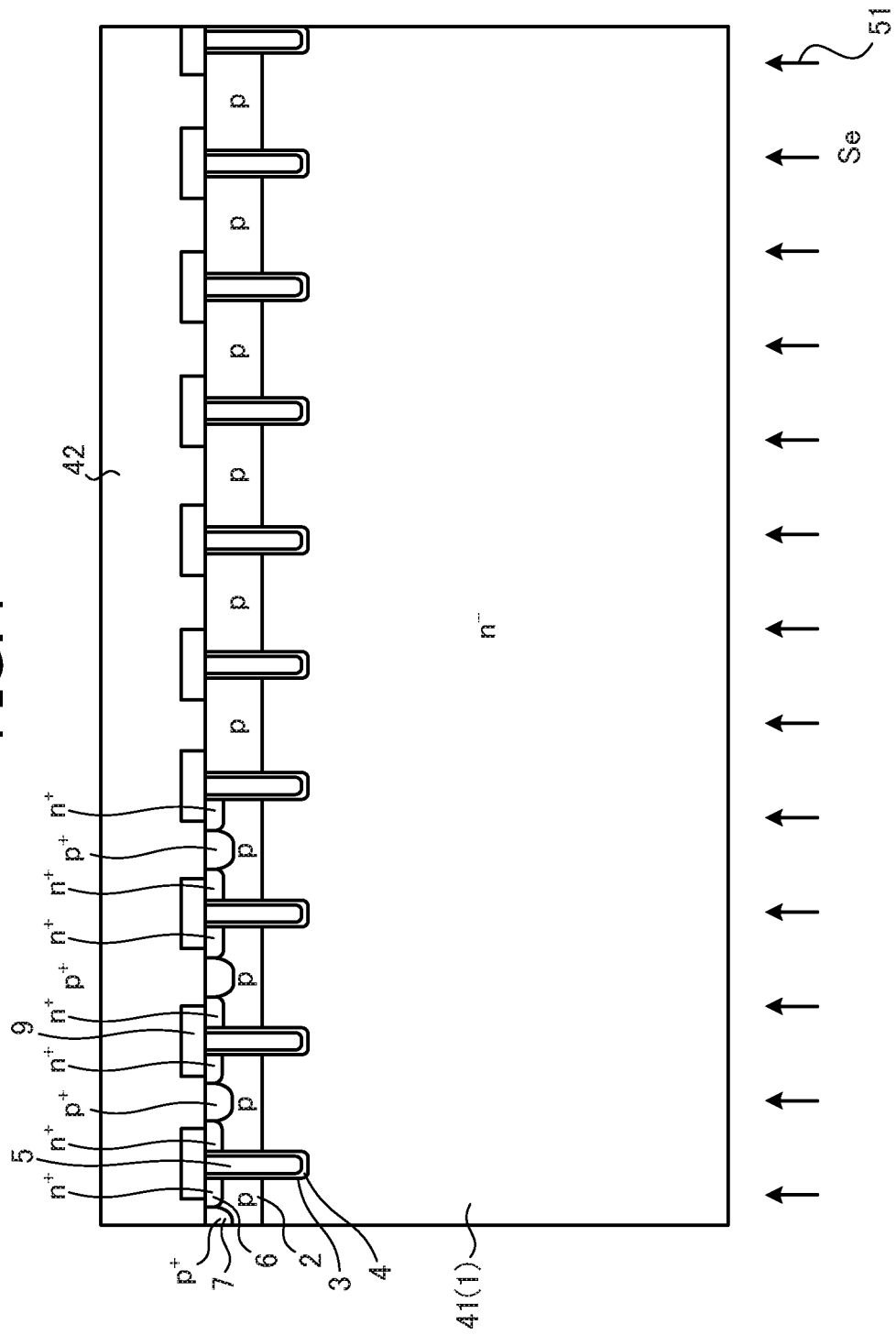

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical will be given the same reference numerals and will not be repeatedly described.

First, findings of the inventors will be described. As a result of diligent research, the inventors found that the following problems occur with a conventional FS structure RC-IGBT integrating an IGBT and a FWD on a single semiconductor substrate. Since the FS structure RC-IGBT is a punch-through structure having a FS layer provided on a thinned wafer rear surface side, a deep diffusion layer including selenium as a dopant is formed as the FS layer to improve yield rate. Further, since the structure includes the IGBT and the FWD integrated on a single semiconductor substrate, a channel region of the IGBT and an anode region of the FWD have a configuration sharing a p-type region on a front surface side of the semiconductor substrate. With such a RC-IGBT, reverse recovery characteristics during FWD operation degrade.

Figure 17:
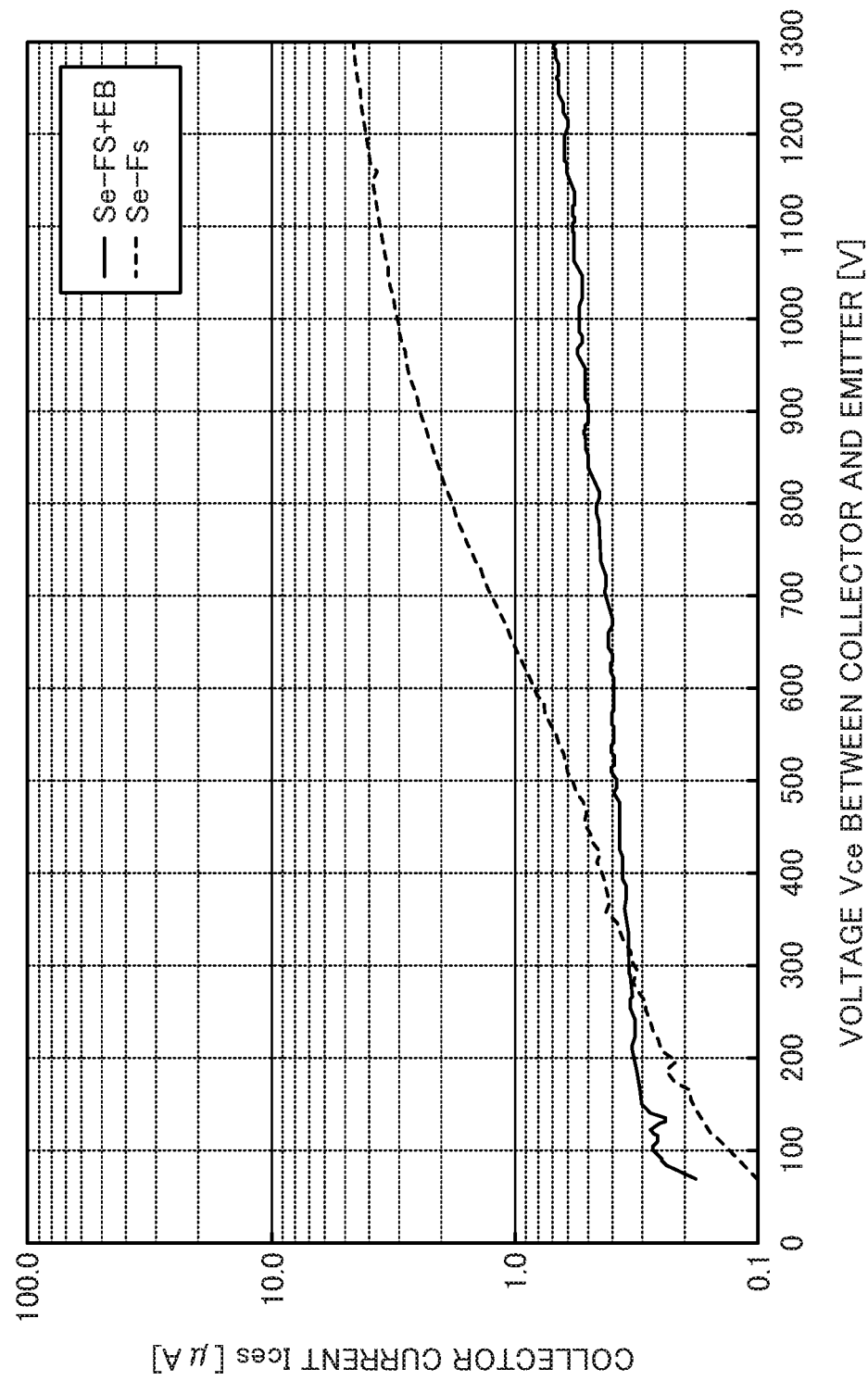
FIG. 17 is a characteristics diagram of leak current characteristics of a RC-IGBT of a conventional field stop structure.

Therefore, to reduce carriers ejected during FWD reverse recovery operation and improve reverse recovery characteristics, carrier lifetime has to be controlled. FIG. 17 is a characteristics diagram of leak current characteristics of a RC-IGBT of a conventional field stop structure. When carrier lifetime is conventionally controlled by irradiating an electron beam (EB) (Se-FS+EB), defects are formed in the FS layer. A problem arises in that defects in the FS layer do not recover even with heat treatment thereafter and leak current between the collector and emitter (CE) increases more than in a case in which no electron beam is irradiated (Se-FS).

The semiconductor device manufactured (produced) by the method of manufacturing a semiconductor device according to the embodiment will be described. FIG. 1A is a cross-sectional view of a structure of the semiconductor device manufactured by the method of manufacturing a semiconductor device according to the embodiment. The semiconductor device according to the embodiment depicted in FIG. 1A includes an IGBT portion 21 and a FWD portion 22. The IGBT portion 21 includes an insulated gate bipolar transistor (IGBT) provided on the same n⁻-type semiconductor substrate that becomes an n⁻-type drift layer 1. The FWD portion 22 includes a freewheeling diode (FWD). The FWD of the FWD portion 22 is connected in antiparallel to the IGBT of the IGBT portion 21. In other words, the semiconductor device according to the embodiment depicted in FIG. 1A is a reverse conducting IGBT (RC-IGBT).

In particular, in the IGBT portion 21, on the front surface of the n⁻-type semiconductor substrate, a MOS gate (insulated gate including a metal oxide film semiconductor) structure 20 of the IGBT is provided. The MOS gate structure 20 is constituted by a p-type base layer 2, a gate oxide film (i.e., gate insulating film) 4, and a gate electrode 5. The p-type base layer 2 is provided in a surface layer on the front surface of the n⁻-type semiconductor substrate. A trench 3 that penetrates the p-type base layer 2 and reaches the n⁻-type drift layer 1 is provided at predetermined intervals. In the trench 3, the gate oxide film 4 is provided along a bottom and side walls of the trench 3.

Further, in the trench 3, the gate electrode 5 including, for example, poly-silicon is provided via the gate oxide film 4. In the p-type base layer 2, an n⁺-type emitter region 6 and a p⁺-type contact region 7 are selectively provided. The n⁺-type emitter region 6 and the p⁺-type contact region 7 are in contact with each other. The n⁺-type emitter region 6 is in contact with a side wall of the trench 3 and faces the gate electrode 5 across the gate oxide film 4. An emitter electrode 8 is in contact with the n⁺-type emitter region 6 and the p⁺-type contact region 7. Further, the emitter electrode 8 is electrically insulated from the gate electrode 5 by an interlayer insulating film 9.

The p-type base layer 2, the trench 3, the emitter electrode 8, and the interlayer insulating film 9 are provided in the IGBT portion 21 and the FWD portion 22. In other words, in the FWD portion 22, on the surface layer on the front surface of the n⁻-type semiconductor substrate, similar to the IGBT portion 21, the p-type base layer 2, the trench 3, the emitter electrode 8, and the interlayer insulating film 9 are provided. In the FWD portion 22, the n⁺-type emitter region 6 and the p⁺-type contact region 7 are not provided. A portion of the p-type base layer 2 doubles as a FWD p-type anode layer. Further, a portion of the emitter electrode 8 doubles as anode electrode and is in contact with the p-type base layer 2 between adjacent trenches 3.

In a surface layer of a rear surface of the n⁻-type semiconductor substrate, in the IGBT portion 21, a p⁺-type collector region 10 is selectively provided. Further, in the surface layer of the rear surface of the n⁻-type semiconductor substrate, in the FWD portion 22, an n⁺-type cathode region 11 is selectively provided. The n⁺-type cathode region 11 is provided adjacent to the p⁺-type collector region 10 along a horizontal direction on the rear surface of the n⁻-type semiconductor substrate. A collector electrode 13 is in contact with the p⁺-type collector region 10. Further, the collector electrode 13 doubles as a cathode electrode and is in contact with the n⁺-type cathode region 11.

In the n⁻-type drift layer 1, a region (hereinafter, first low-lifetime region) 31 formed by crystal defects formed by light ions, for example, helium (He⁺) or protons (H⁺) added as a lifetime killer is provided. The first low-lifetime region 31 has a lifetime lower than that of other regions. The first low-lifetime region 31 has a predetermined thickness and is provided on the front surface side of the n⁻-type semiconductor substrate, in the IGBT portion 21 and the FWD portion 22. The first low-lifetime region 31 has a first lifetime minimum region 31$a$ having a lifetime value that is shortest in the first low-lifetime region 31 and a first lifetime transit region 31$b$ having a lifetime value longer than that of the first lifetime minimum region 31$a$ and shorter than that of other regions.

For example, the first lifetime minimum region 31$a$ corresponds to a range Rp1 of irradiated light ions and a vicinity thereof ($\pm\Delta$Rp1), and the first lifetime transit region 31$b$ corresponds to a region from an incident surface to about Rp1-$\Delta$Rp1, for which the lifetime is reduced by a transit of light ions. FIG. 1B is a characteristics diagram of lifetime. In FIG. 1B, reference character $\tau 1a$ represents a lifetime of the first lifetime minimum region 31$a$ and reference character $\tau 1b$ represents a lifetime of the first lifetime transit region 31$b$. Reference character represents is a lifetime of the n⁻-type semiconductor substrate. Provision of the first low-lifetime region 31 enables a reduction of the carriers ejected during FWD reverse recovery operation.

Further, in the n⁻-type drift layer 1, an n⁺-type field stop (FS) layer 12 including, for example, selenium (Se) as a dopant is provided at a position deeper than the p⁺-type collector region 10 from the rear surface of the n⁻-type semiconductor substrate. The n⁺-type FS layer 12 is provided in the IGBT portion 21 and the FWD portion 22, and is in contact with the n⁻-type drift layer 1, the p⁺-type collector region 10, and the n⁺-type cathode region 11. Further, the n⁺-type FS layer 12 is provided separate from the first low-lifetime region 31. The n⁺-type FS layer 12 has a function of suppressing a depletion layer, which spreads from a pn junction of the n⁻-type drift layer 1 and the p-type base layer 2 in an OFF state, from reaching the p⁺-type collector region 10.

Further, from inside the n⁺-type FS layer 12 over to the rear surface of the n⁻-type semiconductor substrate, a region (hereinafter, second low-lifetime region) 32 formed by crystal defects formed by light ions added as a lifetime killer is provided. The second low-lifetime region 32 has a lower lifetime than other regions. The second low-lifetime region 32 has a second lifetime minimum region 32a having a lifetime value that is shortest in the n⁻-type semiconductor substrate and a second lifetime transit region 32b having a lifetime value that is longer than that of the first lifetime minimum region 31a and shorter than that of the first lifetime transit region 31b. For example, the second lifetime minimum region 32a corresponds to a range Rp2 of irradiated light ions and a vicinity thereof (±ΔRp2), and the second lifetime transit region 32b corresponds to a region from an incident surface to about Rp2-ΔRp2, for which the lifetime is reduced by a transit of light ions.

In FIG. 1A, from the rear surface of the n⁻-type semiconductor substrate to a boundary with the second lifetime minimum region 32a is depicted as the second lifetime transit region 32b (region indicated by heavier hatching than the second lifetime minimum region 32a). In FIG. 1B, reference character τ2a represents a lifetime of the second lifetime minimum region 32a and reference character τ2b represents a lifetime of the second lifetime transit region 32b. Provision of the second low-lifetime region 32 enables suppression of tail current occurring at a time of turn OFF of the IGBT and enables adjustment of FWD reverse recovery time.

The lifetime τ2a of the second lifetime minimum region 32a may be shorter than the lifetime τ1a of the first lifetime minimum region 31a. The reason for this as follows. The RC-IGBT differs from a case of a FWD alone, and has the p⁺-type collector region 10 on the rear surface side of the n⁻-type semiconductor substrate. Therefore, in the RC-IGBT, during FWD reverse recovery operation, excess holes are injected into the n⁻-type drift layer 1 from the p⁺-type collector region 10 and FWD reverse recovery time tends to become longer than a desired design reverse recovery time. Thus, the lifetime τ2a of the second lifetime minimum region 32a is made shorter than the lifetime τ1a of the first lifetime minimum region 31a whereby the FWD reverse recovery time may be shortened to become the desired reverse recovery time.

Spreading widths of the vicinities (±ΔRp1, ±ΔRp2) of the ranges Rp1, Rp2 of the irradiated light ions are dependent on the lifetimes τ1a, τ2a of the first and second lifetime minimum regions 31a, 32a, respectively. In particular, the lifetime τ2a of the second lifetime minimum region 32a is shorter than the lifetime τ1a of the first lifetime minimum region 31a whereby the spreading width of the vicinity (±ΔRp2) of the range Rp2 of the irradiated light ions is shorter than the spreading width of the vicinity (±ΔRp1) of the range Rp1 of the irradiated light ions. The spreading width is a width of a peak indicating the lifetimes τ1a, τ2a of the first and second lifetime minimum regions 31a, 32a depicted in FIG. 1B. An average lifetime of the first low-lifetime region 31 is mainly dependent on the lifetime τ1a of the first lifetime minimum region 31a. An average lifetime of the second low-lifetime region 32 is mainly dependent on the lifetime τ2a of the second lifetime minimum region 32a.

The method of manufacturing a semiconductor device according to the embodiment will be described taking, as an example, a case in which a 1200V RC-IGBT for a rated current of 400 A is manufactured. FIGS. 2, 3, 4, 5, 6, 7, 8, and 9 are cross-sectional views of the semiconductor device according to the embodiment during manufacture. First, as depicted in FIG. 2, for example, a silicon substrate (hereinafter, Si substrate) 41 produced by a Floating Zone (FZ) technique is prepared to have a thickness t of 650 μm and a diameter of 6 inches. Resistivity of the Si substrate 41 is about 40 Ωcm to 80 Ωcm in the case of a 1200V rating and, for example, may be set as 55 Ωcm.

Next, by an ordinary method, on a front surface of the Si substrate 41 to become the n⁻-type drift layer 1, the MOS gate structure 20 of a trench gate type (the p-type base layer 2, the trench 3, the gate oxide film 4, and the gate electrode 5), the n⁺-type emitter region 6, the p⁺-type contact region 7, the interlayer insulating film 9 and the like are formed. Next, the front surface on which the MOS gate structure 20 and the like are formed on the Si substrate 41 is protected by a resist 42. Next, as depicted in FIG. 3, a rear surface of the Si substrate 41 is ground until, for example, the thickness t of the Si substrate 41 is 125 μm. Next, the rear surface of the Si substrate 41 is etched and a grinding distortion layer (not depicted) of the rear surface of the Si substrate 41 is removed.

Figure 5:
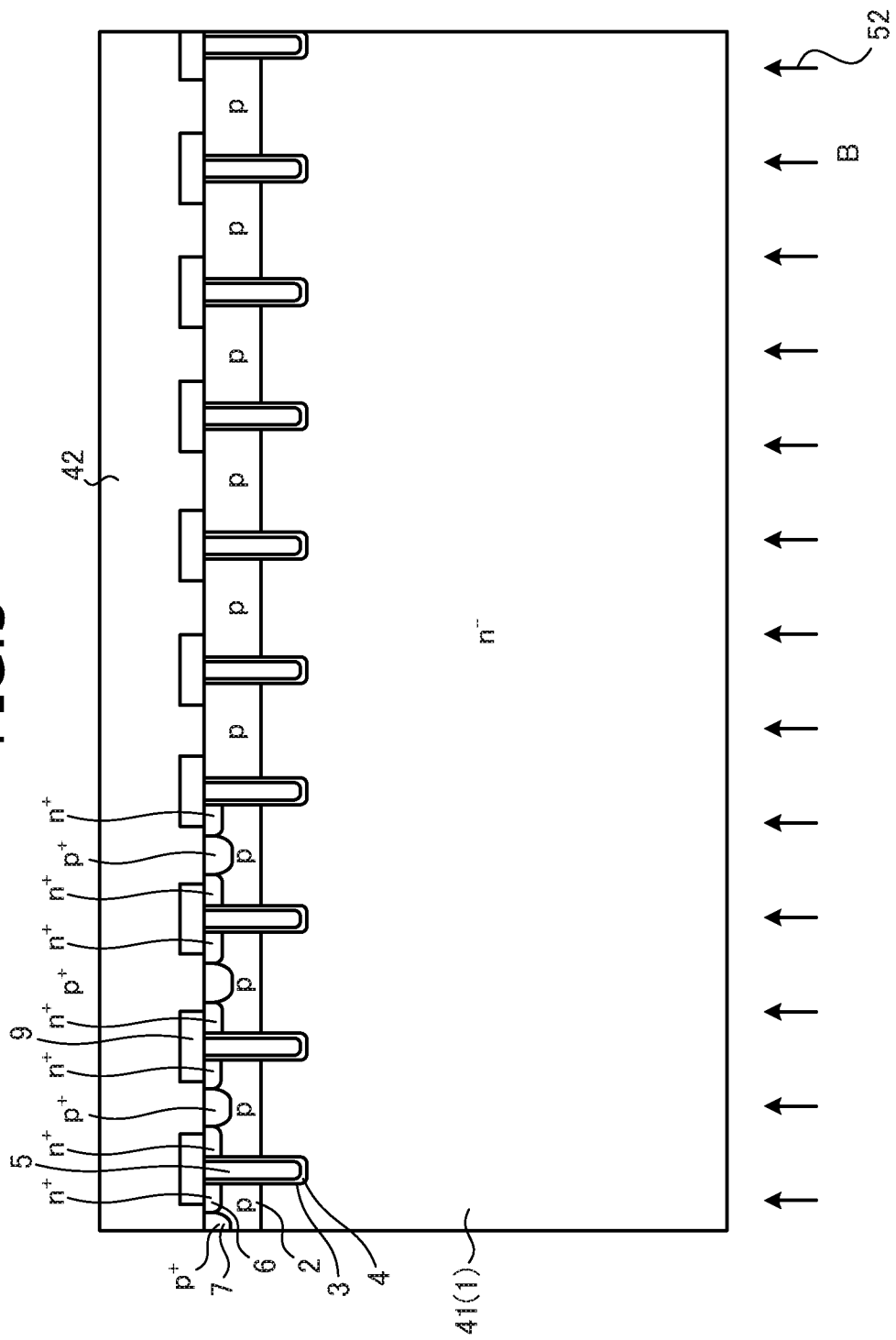

As depicted in FIG. 4, the entire ground rear surface of the Si substrate 41, for example, is subject to a first ion implantation 51 of selenium at a dose amount of $3 \times 10^{14}/cm^2$ and an acceleration energy of 100 keV. Since the impurity to be implanted by the first ion implantation 51 is selenium having a relatively large diffusion coefficient, the n⁺-type FS layer 12 may be made a deep diffusion layer and a RC-IGBT yield rate may be enhanced. Next, as depicted in FIG. 5, the entire ground rear surface of the Si substrate 41, for example, is subject to a second ion implantation 52 of boron (B) at a dose amount of $8 \times 10^{13}/cm^2$ and acceleration energy of 40 keV. The second ion implantation 52 is an ion implantation for forming the p⁺-type collector region 10.

Figure 6:
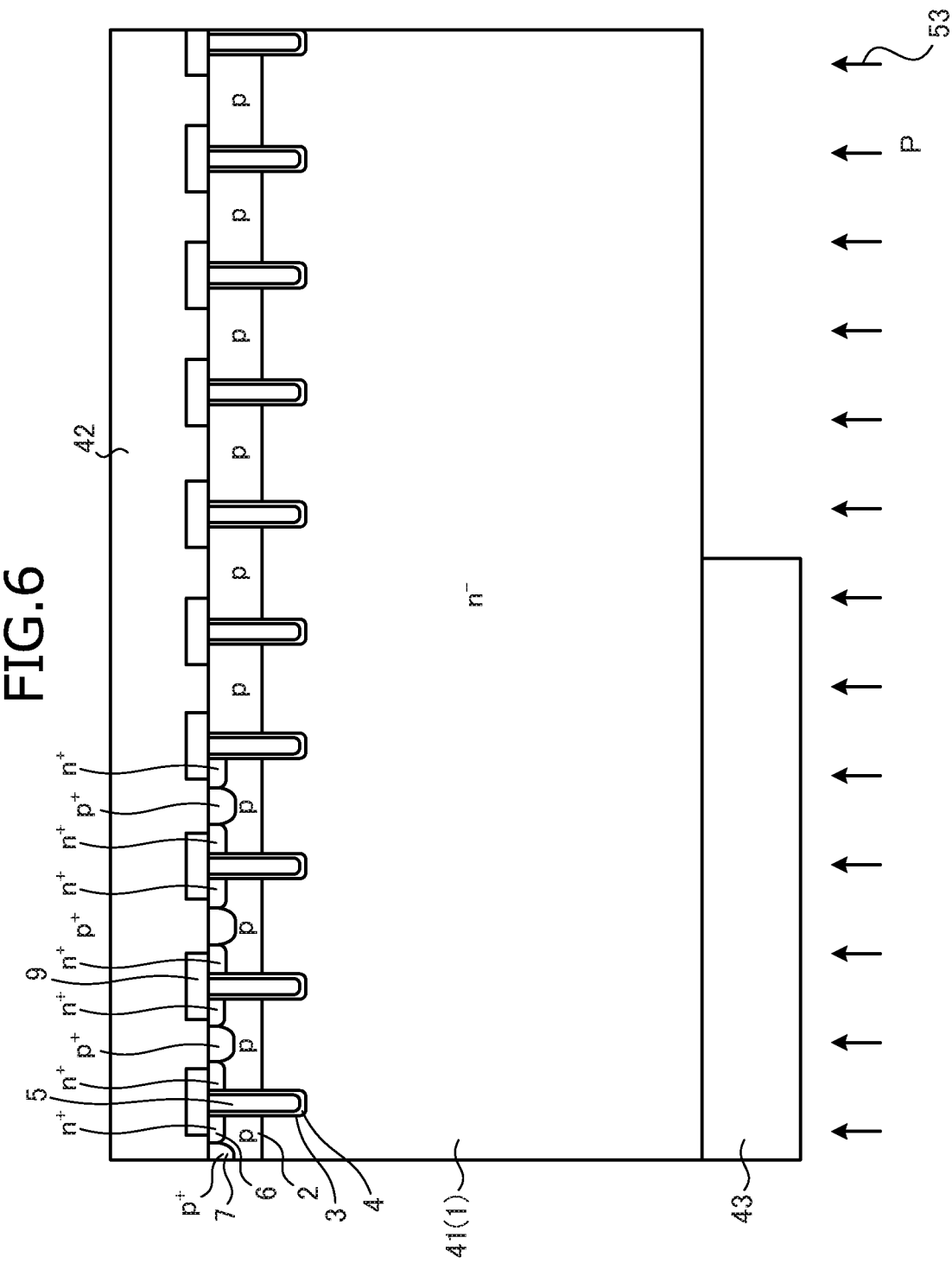

Next, as depicted in FIG. 6, a resist 43 of a thickness of, for example, 2 μm is applied to the rear surface of the Si substrate 41. Next, for example, a double sided aligner is used and a pattern of the n⁺-type cathode region 11 is projected onto the resist 43. Thereafter, by photolithography, the resist 43 is patterned, exposing a formation region of the n⁺-type cathode region 11. Next, the resist 43 is used as a mask and the rear surface of the Si substrate 41, for example, is subject to a third ion implantation 53 of phosphorus (P) at a dose amount of $2 \times 10^{15}/cm^2$ and acceleration energy of 110 keV. The third ion implantation 53 is an ion implantation for forming the n⁺-type cathode region 11. The dose amount of phosphorus in the third ion implantation 53, for example, may be $1 \times 10^{15}/cm^2$ or higher.

Figure 7:
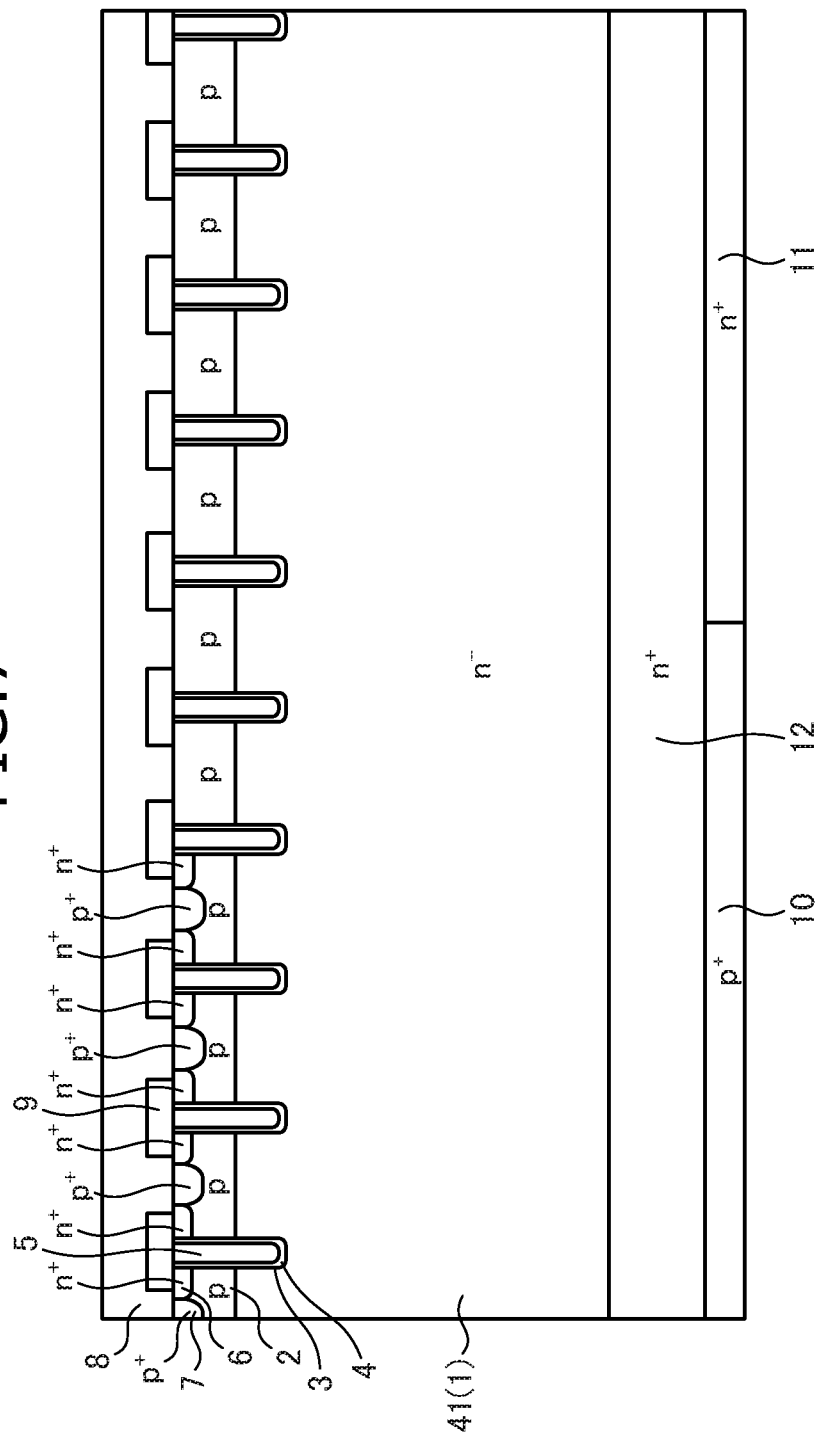

Next, as depicted in FIG. 7, the resist 42 on the front surface of the Si substrate 41 and the resist 43 on the rear surface of the Si substrate 41 are peeled. Next, for example, a first annealing process (first heat treatment) is performed at 950 degrees C. for about 30 minutes, activating the impurities implanted by the first to third ion implantations 51 to 53. As a result, in the surface layer of the rear surface of the Si substrate 41, the p⁺-type collector region 10, the n⁺-type cathode region 11, and the n⁺-type FS layer 12 are formed. Next, on the front surface of the Si substrate 41, for example, an aluminum silicon (Al—Si) film having a thickness of 5 μm is deposited and patterned by photolithography, forming the emitter electrode 8.

Figure 8:
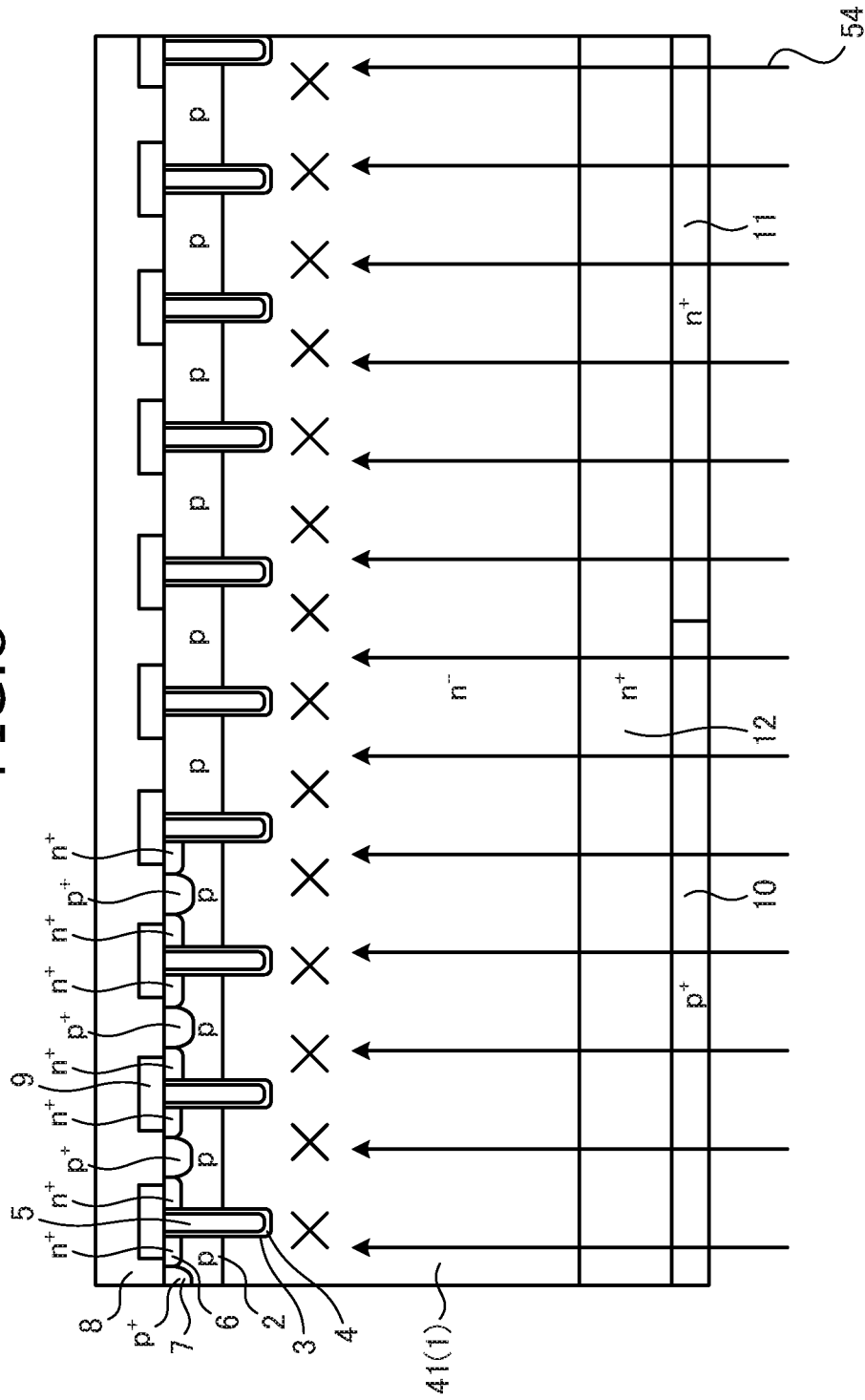

Next, as depicted in FIG. 8, from the rear surface of the Si substrate 41 to the entire rear surface, light ions such as helium or protons are irradiated having the predetermined range Rp1 (hereinafter, first light ion irradiation) 54, forming in the n⁻-type drift layer 1, a defect layer (the first low-lifetime region 31) toward the front surface side of the Si substrate 41. An irradiation position of the first light ion irradiation 54 may be a distance in a range of, for example, 20 μm or less from the front surface of the Si substrate 41 to enable realization of a desired design breakdown voltage or higher. The distance from the rear surface of the Si substrate 41 to the irradiation position of the first light ion irradiation 54 is the range Rp1 of the light ions in the first light ion irradiation 54.

Figure 9:
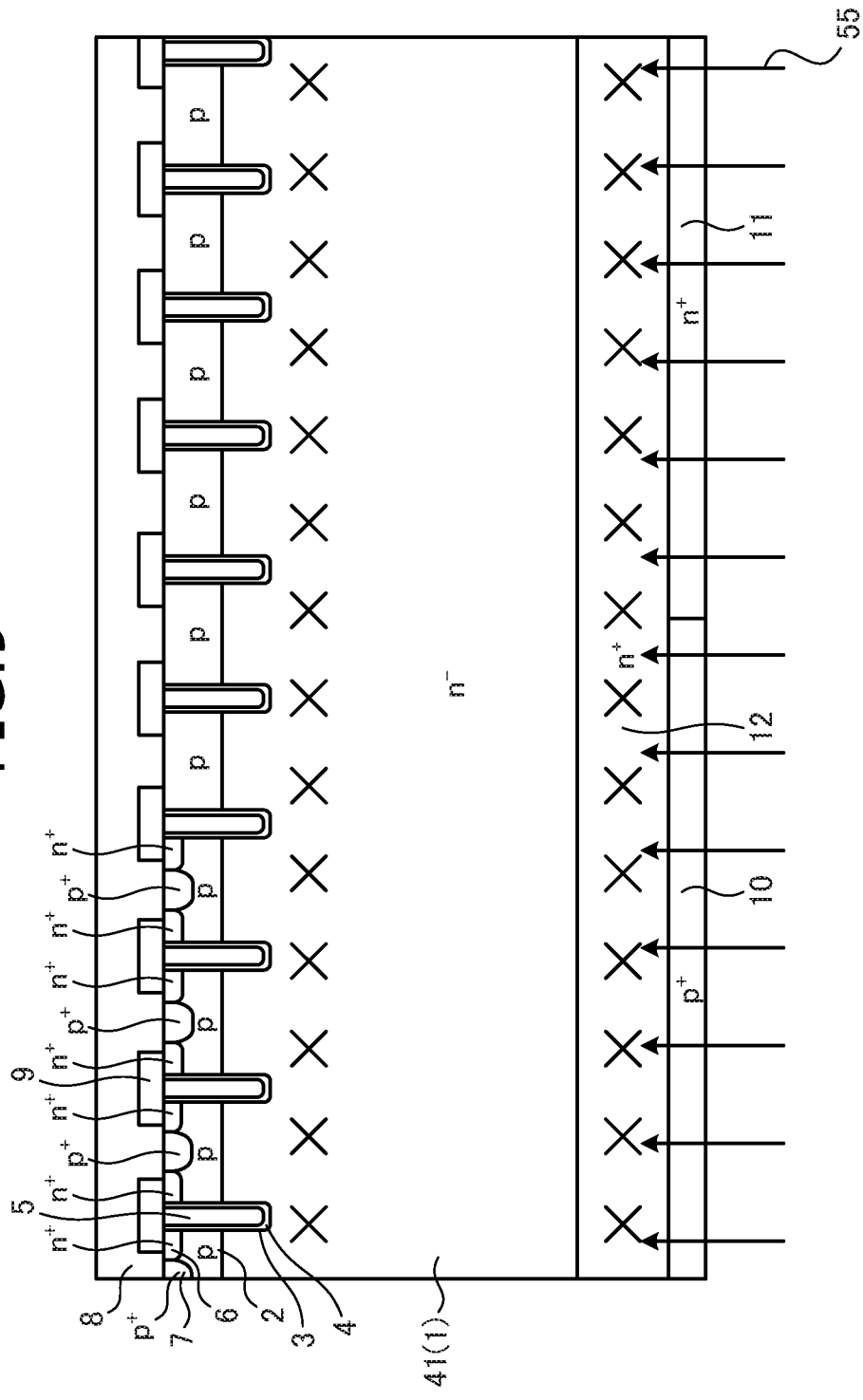

In FIG. 8, x's in the n⁻-type drift layer 1 represent crystal defects created in the first lifetime minimum region 31a by the first light ion irradiation 54 (similarly in FIG. 9). Crystal defects formed in a region about Rp1-ΔRp1 from the rear surface of the Si substrate 41, for which the lifetime is shortened by the transit of light ions are not depicted (similarly in FIG. 9). The region about Rp1-ΔRp1 from the rear surface of the Si substrate 41 and for which the lifetime is shortened by the transit of light ions is the first lifetime transit region 31b.

Next, as depicted in FIG. 9, from the rear surface of the Si substrate 41 to the entire rear surface, light ions are irradiated having the predetermined range Rp2 (hereinafter, second light ion irradiation) 55, forming a defect layer (the second low-lifetime region 32) in the n⁺-type FS layer 12. The acceleration energy of the second light ion irradiation 55 is lower than the acceleration energy of the first light ion irradiation 54 and may be, for example, 4.3 MeV or less. The range Rp2 of the light ions in the second light ion irradiation 55 may be, for example, 15 μm or less from the rear surface of the Si substrate 41 so that the breakdown voltage may be increased higher than in a case in which the first low-lifetime region 31 alone is provided.

In FIG. 9, x's in the n⁺-type FS layer 12 represent crystal defects formed in the second lifetime minimum region 32a by the second light ion irradiation 55. Crystal defects formed in a region about Rp2-ΔRp2 from the rear surface of the Si substrate 41, for which the lifetime is shortened by the transit of light ions are not depicted. The region about Rp2-ΔRp2 from the rear surface of the Si substrate 41 and for which the lifetime is shortened by the transit of light ions is the second lifetime transit region 32b.

Dose amounts of the first and second light ion irradiations 54, 55 may be, for example, $1 \times 10^{10}/cm^2$ to $1 \times 10^{12}/cm^2$. Further, the dose amount of the second light ion irradiation 55 may be higher than the dose amount of the first light ion irradiation 54. Making the dose amount of the second light ion irradiation 55 higher than the dose amount of the first light ion irradiation 54 enables the lifetime of the second low-lifetime region 32 to be made shorter than the lifetime of the first low-lifetime region 31. The rear surface of the Si substrate 41, for example, may be covered by a mask, and the first and second light ion irradiations 54, 55 may be performed with respect to only a portion of the rear surface of the Si substrate 41.

An irradiation sequence of the first and second light ion irradiations 54, 55 is not limited to the sequence above and may be variously changed. For example, after the second light ion irradiation 55, the first light ion irradiation 54 may be performed. Further, irradiation sessions of the first and second light ion irradiations 54, 55 may be variously changed. For example, the first and second light ion irradiations 54, 55 may be each performed one time or may be performed two or more times. Further, when the first and second light ion irradiations 54, 55 are each performed multiple times, the first and second light ion irradiations 54, 55 may be alternately performed.

Next, for example, a second annealing process (second heat treatment) is performed at 370 degrees C. for one hour, reducing the defect density of the crystal defects formed in the n⁺-type FS layer 12 by the second light ion irradiation 55. By the second annealing process, a donor region is formed in the n⁺-type FS layer 12 by light ions (for example, protons). The second annealing process may be performed, for example, at a temperature of 350 to 370 degrees C. for about 1 to 2 hours. Thereafter, on the rear surface of the Si substrate 41, for example, aluminum (Al), titanium (Ti), nickel (Ni), and gold (Au) are each deposited sequentially, for example, to have thicknesses of 1 μm, 0.07 μm, 1 μm, and 0.3 μm, respectively, forming the collector electrode 13 common to the IGBT portion 21 and the FWD portion 22. Thus, the FS structure RC-IGBT depicted in FIG. 1A is complete.

Figure 10:
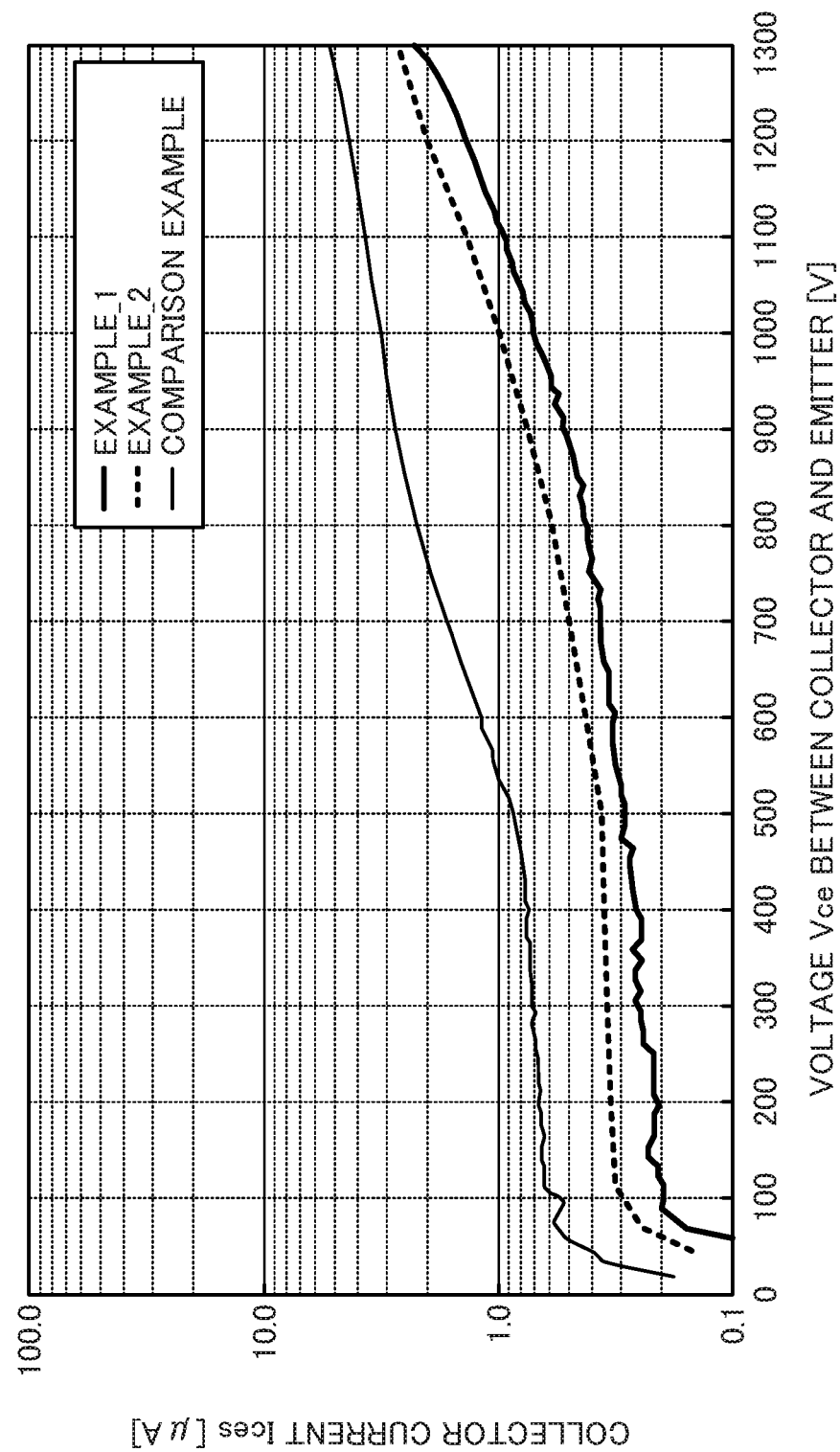
FIG. 10 is a characteristics diagram of leak current characteristics of a semiconductor device manufactured by the method of manufacturing a semiconductor device according to the embodiment.

Leak current between the collector and emitter (CE) of a semiconductor device manufactured by the method of manufacturing a semiconductor device according to the embodiment was verified. FIG. 10 is a characteristics diagram of leak current characteristics of a semiconductor device manufactured by the method of manufacturing a semiconductor device according to the embodiment. First, according to the described method of manufacturing a semiconductor device according to the embodiment, a 1200V FS structure RC-IGBT for a rated current of 400 A was produced (manufactured) under the conditions described in the method of manufacturing a semiconductor device according to the embodiment (hereinafter, example_1).

Further, as another embodiment of the present invention, a FS structure RC-IGBT was produced in which helium (He) was irradiated and lifetime was controlled (hereinafter, example_2). Additionally, as a comparison example, a FS structure RC-IGBT for which lifetime control was performed by electron beam irradiation was produced. In particular, in example_2, from a rear surface of a Si substrate, helium irradiation was performed two times at differing acceleration energies, forming at the same positions as in example_1, the first and the second low-lifetime regions including helium as a lifetime killer. In the comparison example, from a front surface of a Si substrate, an electron beam of 5 MeV, 300 kGy was irradiated. Other aspects of the method of manufacturing of example_2 and the comparison example are identical to those of the method of manufacturing example_1. FIG. 10 depicts a relationship of collector current Ices and voltage Vce between the collector and emitter measured at room temperature (for example, 25 degrees C.) for example_1, example_2, and the comparison example.

From the results depicted in FIG. 10, in the comparison example, leak current between the collector and emitter (hereinafter, CE leak current) (collector current Ices) for a rated voltage of 1200V was 4.0 μA. In contrast, in example_1, CE leak current for a rated voltage of 1200V was 1.5 μA and in example_2, CE leak current for a rated voltage of 1200V was 2.0 μA. In other words, it was confirmed that in example_1, CE leak current for a rated voltage of 1200V could be reduced 60% or more compared to the comparison example and in example_2, CE leak current for a rated voltage of 1200V could be reduced by half compared to the comparison example. The reason for this is as follows.

In the case of electron beam irradiation, point defects are introduced in the entire FS layer by selenium whereby vacancies (including divacancies) and complex defects of selenium and vacancies are distributed throughout the FS layer, the complex defects become generation centers, and leak current increases. On the other hand, light ions such as helium or protons and lattice defects thereof are locally present in a portion of the FS layer in a depth direction consequent to selenium whereby the leak current decreases compared to a case without light ions and lattice defects thereof. Therefore, in example_1 and example_2, the leak current may be reduced to greater extent as compared to the comparison example. In addition, the reason that the leak current is lower with protons that with helium is because the ion radius of protons is smaller than the ion radius of helium whereby the size of crystal defects generated in the $n^+$-type FS layer 12 of example_1 may be made smaller than the crystal defects generated in the $n^+$-type FS layer of example_2.

Figure 11:
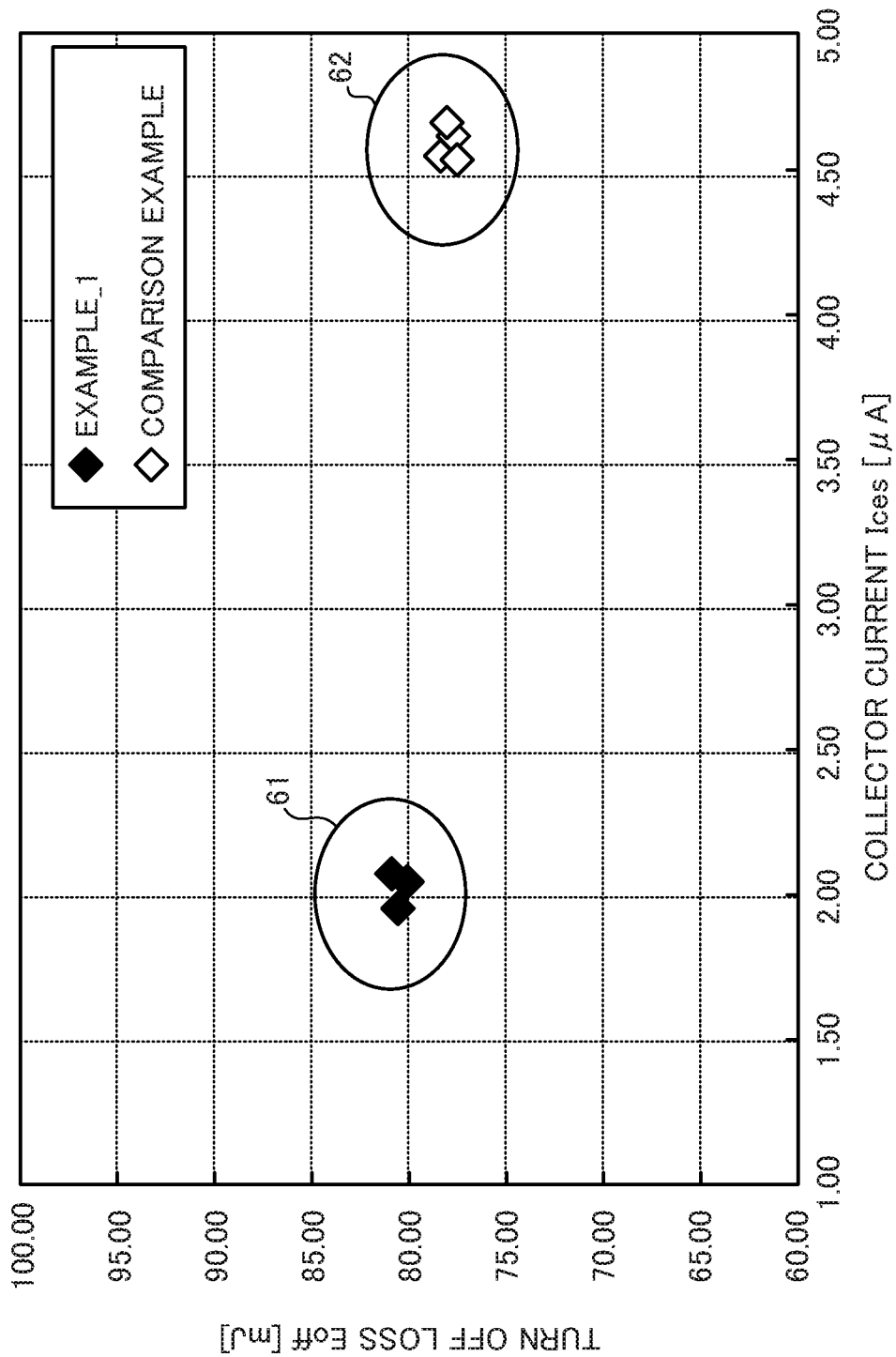
FIG. 11 is a characteristics diagram of turn OFF loss characteristics of a semiconductor device manufactured according to the method of manufacturing a semiconductor device according to the embodiment.
Figure 12:
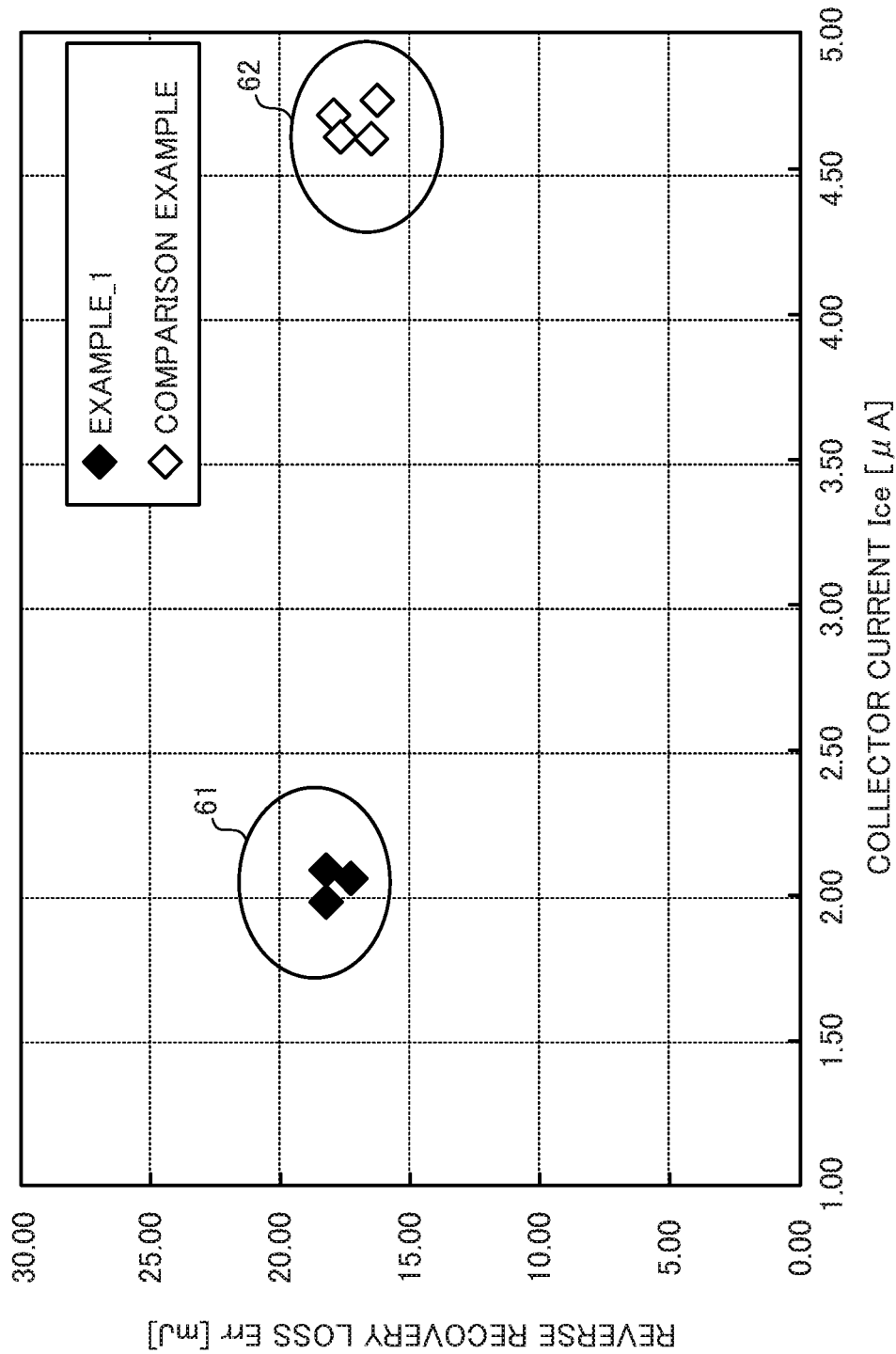
FIG. 12 is a characteristics diagram of reverse recovery loss characteristics of a semiconductor device manufactured according to the method of manufacturing a semiconductor device according to the embodiment.

Switching loss characteristics of a semiconductor device manufactured according to the method of manufacturing a semiconductor device according to the embodiment were verified. FIG. 11 is a characteristics diagram of turn OFF loss characteristics of a semiconductor device manufactured according to the method of manufacturing a semiconductor device according to the embodiment. FIG. 12 is a characteristics diagram of reverse recovery loss characteristics of the semiconductor device manufactured according to the method of manufacturing a semiconductor device according to the embodiment. Example_1 and the comparison example described were each prepared in plural (hereinafter, example_1 group 61 and a comparison example group 62), and turn OFF loss Eoff of the IGBT and reverse recovery loss Err of the FWD were measured for each. Further, in producing the example_1 group 61, the irradiated light ions were protons.

From the results depicted in FIG. 11, the turn OFF loss Eoff of the example_1 group 61 was confirmed to be about the same as the turn OFF loss Eoff of the comparison example group 62. Further, from the results depicted in FIG. 12, the reverse recovery loss Err of the example_1 group 61 was confirmed to be about the same as the reverse recovery loss Err of the comparison example group 62. Therefore, the example_1 group 61 was confirmed to achieve an effect of improving reverse recovery characteristics by carrier recombination to a same extent as the comparison example group 62. Therefore, from the results depicted in FIGS. 10 to 12, the leak current of the example_1 group 61 performing lifetime control by light ions was reduced to a greater extent than that the leak current of the comparison example group 62 performing lifetime control by electron beam, confirming that a gross calorific value of the RC-IGBT was reduced.

Figure 13:
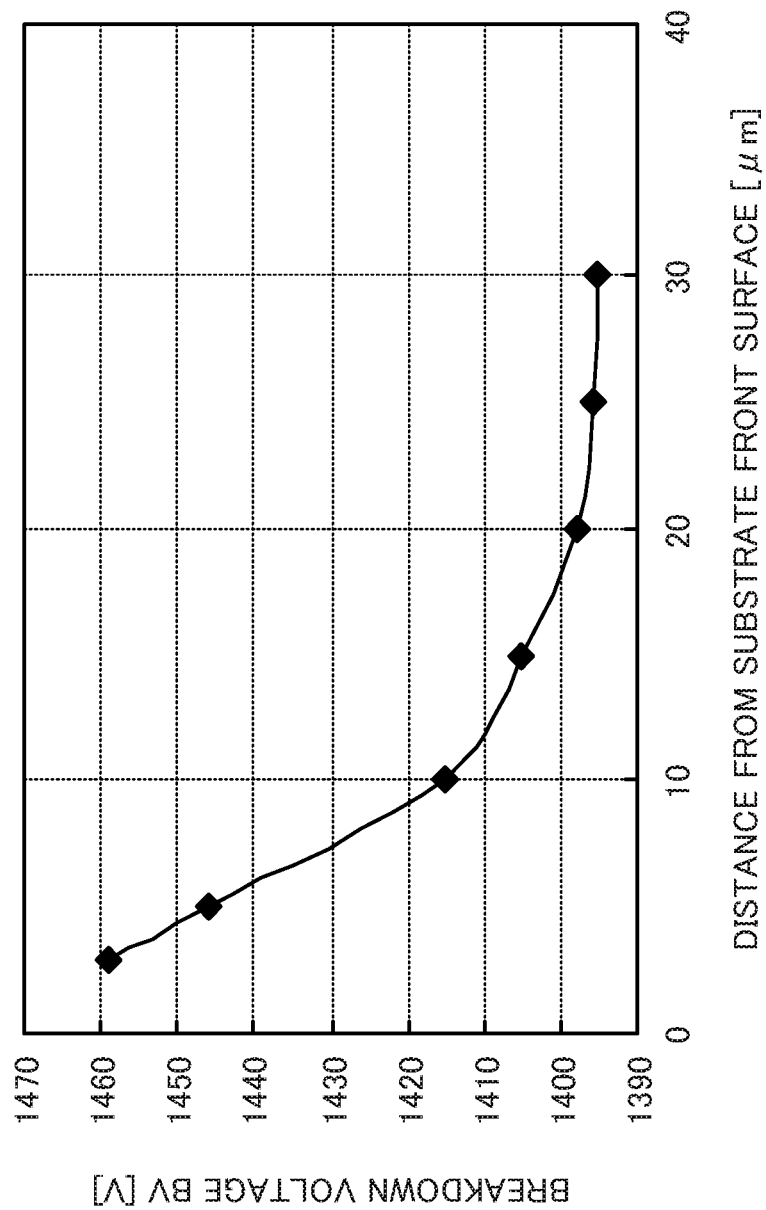
FIG. 13 is a characteristics diagram concerning a relationship of irradiation position of a first light ion irradiation and breakdown voltage of the semiconductor device according to the embodiment.

The range Rp1 of protons in a case in which protons are used as the light ions irradiated by the first light ion irradiation 54 was verified. FIG. 13 is a characteristics diagram concerning a relationship of irradiation position of the first light ion irradiation and breakdown voltage of the semiconductor device according to the embodiment. The range Rp1 (i.e., acceleration energy of the first light ion irradiation 54) of protons in the first light ion irradiation 54 was varied and multiple FS structure RC-IGBTs (hereinafter, example_2') were produced. In example_2', to verify the range Rp1 suitable for the protons in the first light ion irradiation 54, the second light ion irradiation 55 was not performed. Other conditions of the method of manufacturing example_2' were identical to those of the method of manufacturing example_1. From the results depicted in FIG. 13, it was confirmed that breakdown voltage of about 1400V or higher could be realized by setting the irradiation position of the first light ion irradiation 54 to be in a range of 20 µm or less from the front surface of the Si substrate 41.

Figure 14:
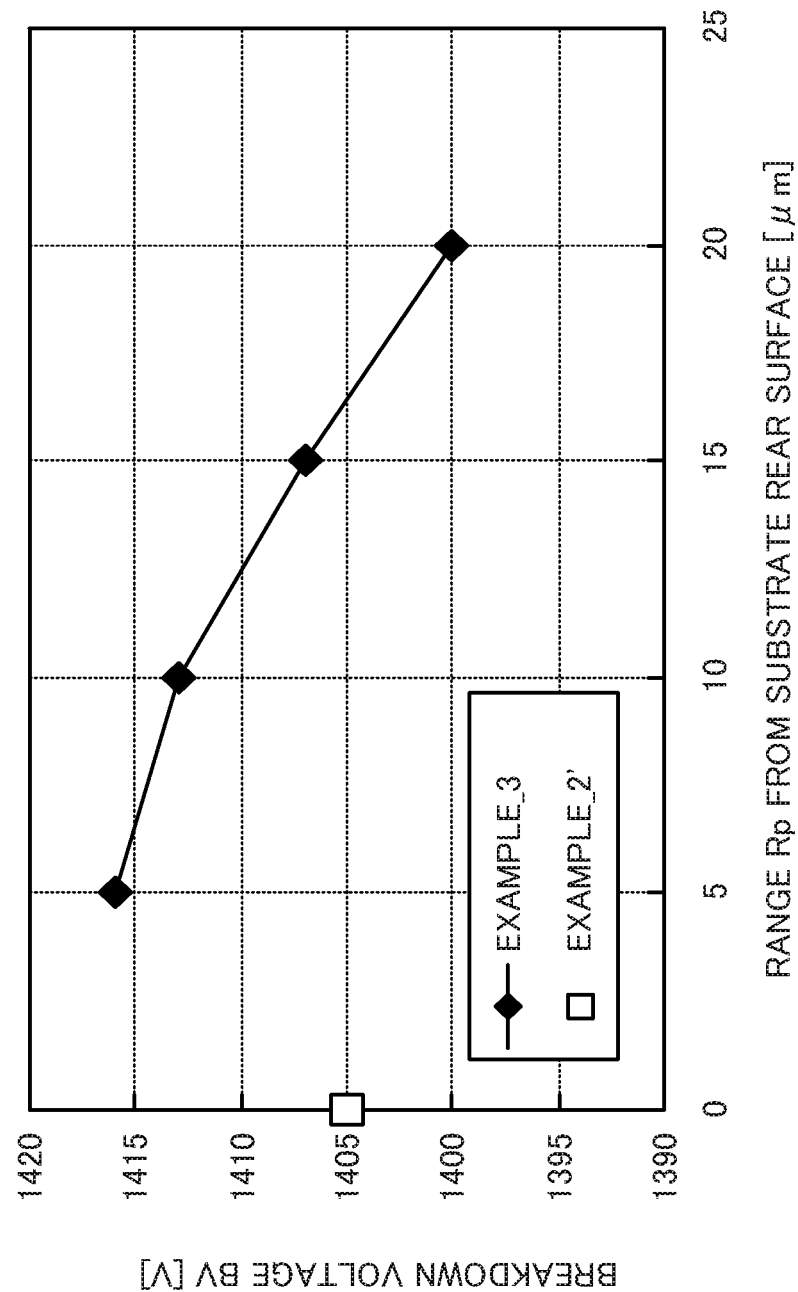
FIG. 14 is a characteristics diagram concerning a relationship of irradiation position of a second light ion irradiation and breakdown voltage of the semiconductor device according to the embodiment.

The range Rp2 of the protons in a case in which protons are used as the light ions irradiated by the second light ion irradiation 55 was verified. FIG. 14 is a characteristics diagram concerning a relationship of irradiation position of the second light ion irradiation and breakdown voltage of the semiconductor device according to the embodiment. The range Rp2 (i.e., acceleration energy of the second light ion irradiation 55) of protons in the second light ion irradiation 55 was varied and multiple FS structure RC-IGBTs (hereinafter, example_3) were produced in plural. The irradiation position of the first light ion irradiation 54 for example_3 was to be 15 µm from the front surface of the Si substrate 41. Other conditions of the method of manufacturing example_3 were identical to those of the method of manufacturing example_1.

Further, for comparison, FIG. 14 depicts example_2' for which the first light ion irradiation 54 (proton irradiation) alone was performed without performing the second light ion irradiation 55. Further, for comparison, FIG. 14 depicts a breakdown voltage of example_2' for which a distance from the front surface of the Si substrate 41 to the irradiation position of the first light ion irradiation 54 was set to be 15 µm. From the results depicted in FIG. 14, it was confirmed that breakdown voltage could be improved to a greater extent by setting the range Rp2 of protons in the second light ion irradiation 55 set to be, for example, 15 µm or less from the rear surface of the Si substrate 41 as compared to a case in which the first light ion irradiation 54 alone is performed.

Figure 15:
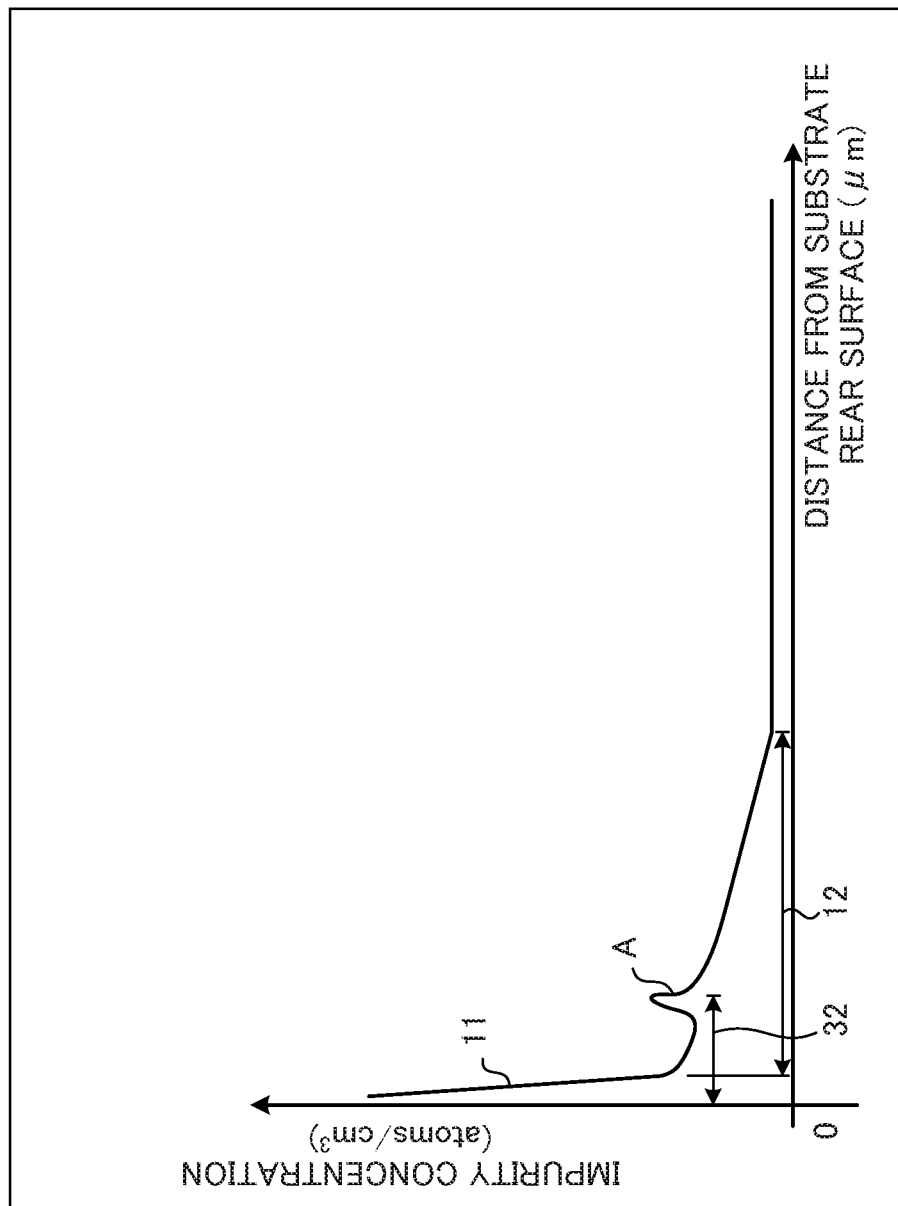
FIG. 15 is a characteristics diagram of an impurity concentration of a field stop layer of the semiconductor device according to the embodiment.
Figure 16:
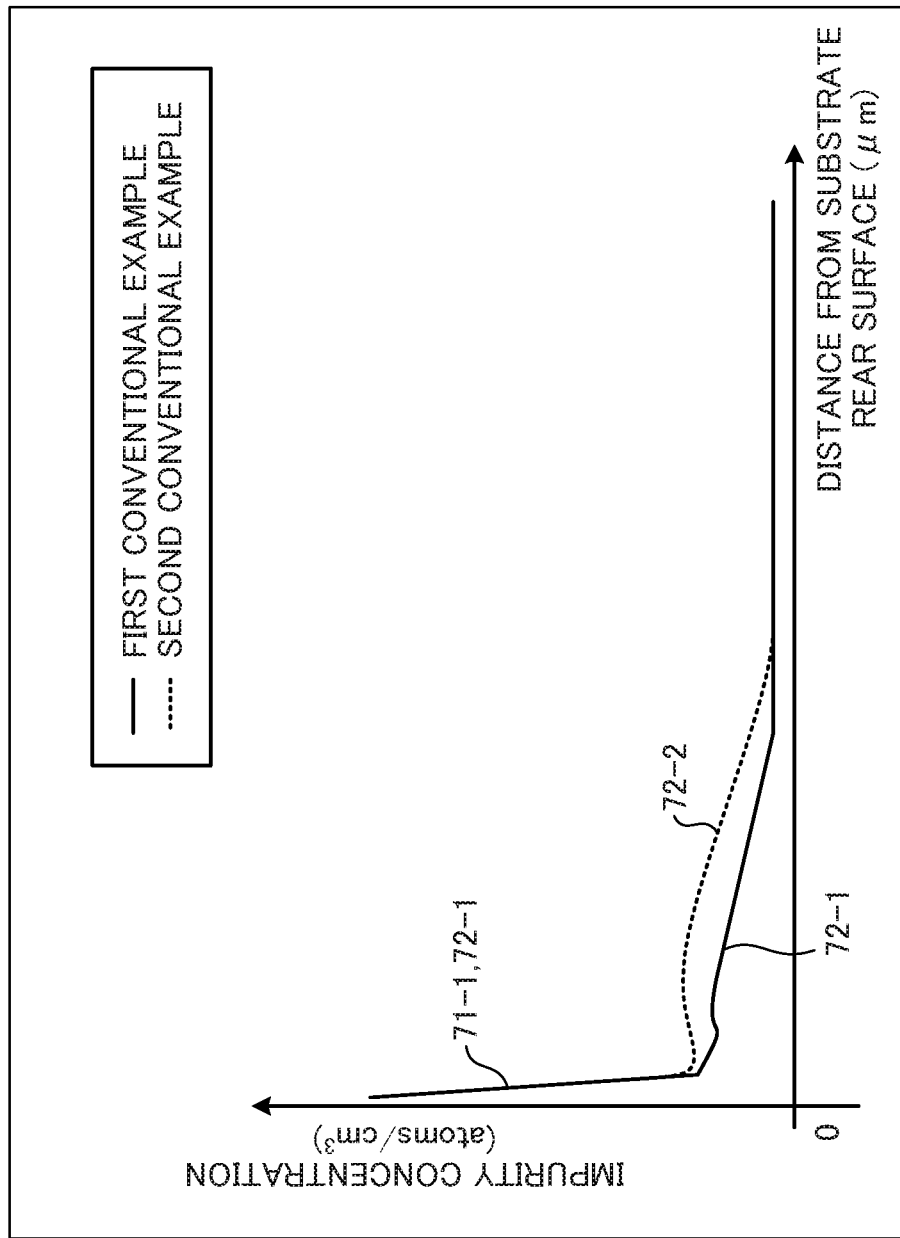
FIG. 16 is a characteristics diagram concerning an impurity concentration of a field stop layer of a conventional semiconductor device.

Verification concerning the $n^+$-type FS layer 12 of the semiconductor device according to the embodiment was performed. FIG. 15 is a characteristics diagram of the impurity concentration of the field stop layer of the semiconductor device according to the embodiment. FIG. 16 is a characteristics diagram concerning the impurity concentration of the field stop layer of a conventional semiconductor device. Concerning example_1 described, results of measurement of the impurity concentration from the substrate rear surface of the FWD portion 22 are depicted in FIG. 15. For comparison, concerning a conventional RC-IGBT (hereinafter, first and second conventional examples) in which the second light ion irradiation 55 is not performed, results of measurement of the impurity concentration from the substrate rear surface of the FWD portion are depicted in FIG. 16.

In the first conventional example, after first to third ion implantations for forming an $n^+$-type FS layer 72-1, a $p^+$-type collector region, and an $n^+$-type cathode region 71-1, the first annealing process of concurrently activating the impurities implanted by the first to third ion implantations is performed. Conditions of the first to third ion implantations and of the first annealing process of the first conventional example are identical to those of the method of manufacturing example_1. The results, as depicted in FIG. 16, confirm that in the first conventional example, the impurity concentration of the $n^+$-type FS layer 72-1 becomes lower than the normal impurity concentration. A normal impurity concentration is the impurity concentration of an $n^+$-type FS layer 72-2 of the second conventional example.

In the second conventional example, the dose amount of selenium in the first ion implantation, for example, is increased to about $3\times10^{14}/cm^2$ or laser annealing for activating an n$^+$-type cathode region 71-2 is added separately from the first annealing process whereby the n$^+$-type FS layer 72-2 is formed in which a decline of the impurity concentration is supplemented. Therefore, in the second conventional example, it has been confirmed that problems arise such as decreased throughput of manufacturing processes consequent to the dose amount of the first ion implantation for forming the n$^+$-type FS layer 72-2 being increased, increased lead-time consequent to the addition of laser annealing, and the like.

In contrast, as depicted in FIG. 15, it was confirmed that in example_1, after the first to third ion implantations 51 to 53 and the first annealing process, the second light ion irradiation 55 for forming the second low-lifetime region 32 is performed whereby a donor region A may be formed in the n$^+$-type FS layer 12 by light ions. It was confirmed that the impurity concentration of the n$^+$-type FS layer 12 is supplemented by the donor region A consequent to the light ions, and becomes about the same as the impurity concentration of the n$^+$-type FS layer 72-2 of the second conventional example. Concerning light ions as donors, for example, it is known that protons are shallow donors and helium is a deep donor. Therefore, it was confirmed that a lifetime killer effect for adjusting the reverse recovery time of the FWD portion 22 is obtained by the second light ion irradiation 55, and the problems arising in the first and second conventional examples may be resolved by a donor effect of supplementing the impurity concentration of the n$^+$-type FS layer 12. Concerning light ions as donors, helium is effective and preferably protons are effective.

As described, according to the embodiment, by the first and second light ion irradiation, the first and the second low-lifetime regions are formed whereby the size of the crystal defects formed in the n$^+$-type FS layer may be reduced compared to a case in which lifetime is controlled conventionally by electron beam irradiation. As a result, the CE leak current of a FS structure RC-IGBT using a thin wafer may be reduced 50% or more compared to a conventional RC-IGBT controlling lifetime by electron beam irradiation. Further, according to the embodiment, by forming the n$^+$-type FS layer including selenium as dopant, the n$^+$-type FS layer may be made a deep diffusion layer, enabling the yield rate to be improved. Therefore, in the FS structure RC-IGBT, increases of the CE leak current may be suppressed and the yield rate may be increased.

Further, according to the embodiment, by forming the first low-lifetime region in the n$^-$-type drift layer, carriers ejected during FWD reverse recovery operation may be decreased, enabling loss occurring during FWD reverse recovery operation to be decreased. By forming the second low-lifetime region in the n$^+$-type FS layer, tail current occurring at the time of turn OFF of the IGBT may be suppressed and the reverse recovery time of the FWD may be adjusted. Therefore, in the FS structure RC-IGBT, carrier lifetime may be controlled and electrical loss during operation may be reduced.

Further, according to the embodiment, by forming the second low-lifetime region including light ions as a lifetime killer by the second light ion irradiation, a donor region by deep donors (helium) or shallow donors (protons) caused by light ions in the n$^+$-type FS layer may be formed and the impurity concentration of the n$^+$-type FS layer may be supplemented. As a result, the necessary dose amount of the impurity of the first ion implantation for forming the n$^+$-type FS layer may be reduced. Therefore, throughput of the manufacturing processes may be improved. Further, the impurity concentration of the n$^+$-type FS layer may be supplemented by merely performing the second light ion irradiation whereby the n$^+$-type FS layer may be formed by a same conventional method without modification.

Further, in a conventional method of irradiating an electron beam from the front surface or rear surface of the n$^-$-type semiconductor substrate to control lifetime, a problem arises in that in order for the electron beam to be transmitted through the entire substrate, defects occur in the gate oxide film of the MOS gate structure, a gate threshold voltage Vth decreases, variation of the gate threshold voltage increases, etc. Defects generated in the gate oxide film cannot be completely recovered by an annealing process (heat treatment) for defect recovery. In the embodiment, the first and second light ion irradiations are performed from the rear surface of the n$^-$-type semiconductor substrate and therefore, defects consequent to light ion irradiation are not generated in the gate oxide film of the MOS gate structure formed on the front surface side of the n$^-$-type semiconductor substrate. Therefore, decreases in the gate threshold voltage and increased variation of the gate threshold voltage maybe avoided.

In the embodiments, although an example of a high-voltage FS structure RC-IGBT using a thin wafer has been described, the embodiments are not limited hereto and various modifications within a scope not departing from the spirit of the invention are possible. For example, in the embodiments, although the MOS gate structure of the IGBT portion is a trench gate type, in place of the trench gate type, a planar type may be used. Further, although a configuration is described in which a portion of the p-type base layer of the MOS gate structure doubles as the p-type anode layer of the FWD, on the surface layer on the front surface of the n$^-$-type semiconductor substrate, a p-type base layer of the MOS gate structure and a p-type anode layer of the FWD may be each selectively provided. Further, in the embodiments, although a first conductivity type is assumed as an n-type and a second conductivity type is assumed as a p-type, the present invention is similarly implemented when the first conductivity type is a p-type and the second conductivity type is an n-type.

According to the present invention, the first and the second low-lifetime regions are formed by light ion irradiation whereby the size of defects formed in a field stop (FS) layer may be reduced, as compared to a case in which lifetime is controlled by electron beam irradiation in a conventional way. As a result, leak current between the collector and emitter (CE) of a FS structure RC-IGBT using a thin wafer maybe reduced more than that of a conventional RC-IGBT that controls lifetime by electron beam irradiation. Further, as described above, by forming a FS layer including selenium as a dopant, the FS layer may be set as a deep diffusion layer, enabling yield rate to be improved.

Further, according to the present invention, the first low-lifetime region is formed in the drift layer whereby carriers ejected during FWD reverse recovery operation in the freewheeling diode portion may be reduced, enabling loss occurring during FWD reverse recovery operation to be reduced. Further, by forming the second low-lifetime region in the FS layer, tail current at the time of turning OFF of the IGBT at the insulated gate bipolar transistor portion is suppressed and FWD reverse recovery time at the freewheeling diode portion may be adjusted. Therefore, in the FS structure RC-IGBT, carrier lifetime is controlled and electrical loss during operation may be reduced.

According to the semiconductor device and method of manufacturing a semiconductor device of the present invention, an effect is achieved in that increases in leak current may be suppressed and the yield rate may be improved. Further, according to the semiconductor device and the method of manufacturing a semiconductor device of the present invention, an effect is achieved in that electrical loss may be reduced.

As described, the semiconductor device and the method of manufacturing a semiconductor device are useful for power semiconductor devices used in power converting equipment such as inverters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate;
   an insulated gate bipolar transistor portion, including:
      a drift layer of a first conductivity type formed in the semiconductor substrate;
      a base layer of a second conductivity type formed on a front surface side of the semiconductor substrate;
      an emitter region of the first conductivity type selectively formed in the base layer;
      at least one gate electrode formed on the front surface side of the semiconductor substrate each with a gate insulating film formed therebetween;
      an emitter electrode electrically connected to both the base layer and the emitter region;
      a collector region of the second conductivity type selectively formed on a rear surface side of the semiconductor substrate; and
      a collector electrode electrically connected to the collector region;
   a freewheeling diode portion, including:
      an anode layer of the second conductivity type formed on the front surface side of the semiconductor substrate and electrically connected to the emitter electrode; and
      a cathode region of the first conductivity type selectively formed on the rear surface side of the semiconductor substrate and electrically connected to the collector electrode;
   a field stop layer of the first conductivity type formed at a position deeper than a position of the collector region from a rear surface of the semiconductor substrate, the field stop layer having an impurity concentration higher than an impurity concentration of the drift layer;
   a first low-lifetime region formed in the semiconductor substrate; and
   a second low-lifetime region formed in the field stop layer, each of the first and second low-lifetime regions has a carrier lifetime shorter than a carrier lifetime of any region of the semiconductor device other than the first and second low-lifetime regions, wherein
   the first low-lifetime region includes
      a first lifetime minimum region, of which a lifetime value is shortest in the first low-lifetime region, and
      a first lifetime transit region formed between the rear surface of the semiconductor substrate and the first lifetime minimum region;
   the second low-lifetime region includes
      a second lifetime minimum region, of which a lifetime value is shortest in the second low-lifetime region; and
      a second lifetime transit region formed between the rear surface of the semiconductor substrate and the second lifetime minimum region;
   a lifetime value of the second lifetime transit region is shorter than a lifetime value of the first lifetime transit region; and
   the lifetime value of the second lifetime minimum region is shorter than the lifetime value of the first lifetime minimum region; and
   the first and second low-lifetime regions are separated by a portion of the field stop layer.

2. The semiconductor device according to claim 1, wherein
   the field stop layer includes selenium as a dopant.

3. The semiconductor device according to claim 1, wherein
   the first low-lifetime region includes light ions.

4. The semiconductor device according to claim 3, wherein
   the second low-lifetime region includes the light ions.

5. The semiconductor device according to claim 4, wherein
   the second low-lifetime region includes a region in which the light ions are converted to donors.

6. The semiconductor device according to claim 5, wherein
   the light ions are those of helium or those of protons.

7. The semiconductor device according to claim 1, wherein
   the carrier lifetime of the second low-lifetime region is shorter than the carrier lifetime of the first low-lifetime region.

8. The semiconductor device according to claim 1, wherein the insulated gate bipolar transistor portion further includes at least one trench penetrating the base layer and the emitter region, and reaching the drift layer, the at least one gate electrode being respectively provided in the at least one trench via the gate insulating film.

9. The semiconductor device according to claim 8, wherein
   the freewheeling diode portion includes a trench formed from the front surface of the semiconductor substrate, a bottom of the trench being positioned in the drift layer, a side wall of the trench contacting the base layer.

10. The semiconductor device according to claim 1, wherein
    the first low-lifetime region and the second low-lifetime region are formed on an entire rear surface of the semiconductor substrate.

11. The semiconductor device according to claim 1, wherein
    a distance from the front surface of the semiconductor substrate to the first lifetime minimum region is no more than 20 µm.

12. The semiconductor device according to claim 1, wherein
    a distance from the rear surface of the semiconductor substrate to the second lifetime minimum region is no more than 15 µm.

13. The semiconductor device according to claim 1, wherein
    a thickness of the second lifetime minimum region in a depth direction of the semiconductor device is smaller than a thickness of the first lifetime minimum region in the depth direction.

* * * * *